(12) United States Patent
Matsutori

(10) Patent No.: US 11,011,399 B2
(45) Date of Patent: May 18, 2021

(54) SUBSTRATE STORING CONTAINER

(71) Applicant: MIRAIAL CO., LTD., Tokyo (JP)

(72) Inventor: Chiaki Matsutori, Tokyo (JP)

(73) Assignee: Miraial Co., Ltd., Tokyo (JP)

(*) Notice: Subject to any disclaimer, the term of this patent is extended or adjusted under 35 U.S.C. 154(b) by 120 days.

(21) Appl. No.: 16/480,519

(22) PCT Filed: Apr. 27, 2018

(86) PCT No.: PCT/JP2018/017191
§ 371 (c)(1),
(2) Date: Jul. 24, 2019

(87) PCT Pub. No.: WO2018/203524
PCT Pub. Date: Nov. 8, 2018

(65) Prior Publication Data
US 2019/0393063 A1 Dec. 26, 2019

(30) Foreign Application Priority Data

May 2, 2017 (WO) .................. PCT/JP2017/017244

(51) Int. Cl.
B65D 85/30 (2006.01)
H01L 21/673 (2006.01)
G05D 7/01 (2006.01)

(52) U.S. Cl.
CPC ..... H01L 21/67389 (2013.01); G05D 7/0186 (2013.01)

(58) Field of Classification Search
CPC . B65D 85/30; H01L 21/673; H01L 21/67389; H01L 21/67393; G05D 7/0186
(Continued)

(56) References Cited

U.S. PATENT DOCUMENTS 5,879,458 A * 3/1999 Roberson, Jr. .... H01L 21/67017
118/715
6,187,182 B1 * 2/2001 Reynolds ........... B01D 46/0004
210/136
(Continued)

FOREIGN PATENT DOCUMENTS

JP 2002-170876 A 6/2002
JP 2010-270823 A 12/2010
(Continued)

OTHER PUBLICATIONS

International Preliminary Report on Patentability dated Jan. 30, 2018 for International Application No. PCT/JP2017/017244, 9 pages.

Primary Examiner — Luan K Bui
(74) Attorney, Agent, or Firm — Muncy, Geissler, Olds & Lowe, P.C.

(57) ABSTRACT

A substrate storing container includes a container main body, a lid body removably attached to a container main body opening portion and able to close the container main body opening portion, a ventilation passage which enables a substrate storing space and a space outside the container main body to communicate with each other, a gas ejecting nozzle portion having a plurality of opening portions through which a gas flowing into the ventilation passage is supplied into the substrate storing space, and a gas flow rate uniformizing unit which enables the gas to flow out through the plurality of opening portions at a uniform flow rate.

7 Claims, 16 Drawing Sheets

(58) Field of Classification Search
USPC .................................. 206/454, 710, 711, 832
See application file for complete search history.

(56) References Cited

U.S. PATENT DOCUMENTS

| | | | |
|---|---|---|---|
| 6,732,877 B2* | 5/2004 | Wu | B65D 51/1616 |
| | | | 206/710 |
| 8,091,592 B2* | 1/2012 | Sato | F16K 15/063 |
| | | | 141/63 |
| 8,387,799 B2 | 3/2013 | Chiu | |
| 2011/0114534 A1* | 5/2011 | Watson | H01L 21/67393 |
| | | | 206/710 |
| 2015/0243538 A1 | 8/2015 | Miyajima | |
| 2015/0357218 A1 | 12/2015 | Lin | |
| 2016/0276190 A1 | 9/2016 | Smith | |
| 2017/0213752 A1* | 7/2017 | Ogawa | H01L 21/67386 |

FOREIGN PATENT DOCUMENTS

| | | |
|---|---|---|
| JP | 3198841 U | 7/2015 |
| JP | 2015-162531 A | 9/2015 |
| JP | 2015-162532 A | 9/2015 |
| JP | 2015-176976 A | 10/2015 |
| JP | 2016-012662 A | 1/2016 |
| JP | 2016-015421 A | 1/2016 |
| JP | 2016-174515 A | 9/2016 |
| JP | 2016-225352 A | 12/2016 |
| JP | 2016-538732 A | 12/2016 |
| JP | 2017-017264 A | 1/2017 |
| WO | WO-2015/057739 A1 | 4/2015 |
| WO | WO-2016/013536 A1 | 1/2016 |

\* cited by examiner

SUBSTRATE STORING CONTAINER

TECHNICAL FIELD

The present invention relates to a substrate storing container used for storing, accommodating, conveying, transporting, or the like a substrate formed of a semiconductor wafer or the like.

BACKGROUND ART

As a substrate storing container for storing a substrate formed of a semiconductor wafer and conveying the substrate in a process in a factory, one has been known conventionally that has a configuration including a container main body and a lid body (for example, see Patent Documents 1 to 4).

One end portion of the container main body has an opening circumferential portion at which a container main body opening portion is formed. The other end portion of the container main body has a tubular wall portion which is closed. A substrate storing space is formed in the container main body. The substrate storing space is formed by being surrounded by the wall portion and can store a plurality of substrates. The lid body can be removably attached to the opening circumferential portion and can close the container main body opening portion. Lateral substrate support portions are provided at the wall portion so as to form a pair in the substrate storing space. When the container main body opening portion is not closed by the lid body, the lateral substrate support portions can support edge portions of a plurality of substrates in a state in which adjacent substrates are arranged in parallel to be spaced apart by a predetermined interval.

A front retainer is provided to a portion which faces the substrate storing space when the container main body opening portion, which is a part of the lid body, is closed. When the container main body opening portion is closed by the lid body, the front retainer can support edge portions of a plurality of substrates. Furthermore, a back side substrate support portion is provided at the wall portion so as to form a pair with the front retainer. The back side substrate support portion can support edge portions of a plurality of substrates. When the container main body opening portion is closed by the lid body, the back side substrate support portion retains a plurality of substrates in a state in which adjacent substrates are arranged in parallel to be spaced apart by a predetermined interval, by supporting the plurality of substrates in cooperation with the front retainer.

Patent Document 1: Japanese Unexamined Patent Application (Translation of PCT Application), Publication No. 2016-538732
Patent Document 2: Japanese Unexamined Patent Application, Publication No. 2017-17264
Patent Document 3: Japanese Unexamined Patent Application, Publication No. 2015-162531
Patent Document 4: U.S. Pat. No. 8,387,799

DISCLOSURE OF THE INVENTION

Problems to be Solved by the Invention

In the substrate storing container described in the above-described publications, the supply of a substitution gas (gas purge) to a diffuser is performed, for example, by vigorously flowing a gas (an inert gas such as nitrogen or dry air from which moisture removed (to 1% or less) (hereinafter, referred to as purge gas)) from the lower portion of the diffuser. However, at the lower portion of the diffuser, particularly in the vicinity of the root of the diffuser, simultaneously with the discharge of the purge gas into the container, air is also drawn into the container due to the Bernoulli phenomenon, so that it is difficult to reliably perform substitution of the gas.

An object of the present invention is to provide a substrate storing container capable of reliably performing substitution of a gas in a substrate storing space.

Means for Solving the Problems

The present invention relates to a substrate storing container including: a container main body which includes a tubular wall portion in which one end portion has an opening circumferential portion at which a container main body opening portion is formed and the other end portion is closed, and has a substrate storing space formed by inner faces of the wall portion, the substrate storing space being able to store a plurality of substrates and communicating with the container main body opening portion; a lid body which is removably attached to the container main body opening portion and is able to close the container main body opening portion; a ventilation passage which enables the substrate storing space and a space outside the container main body to communicate with each other; a gas ejecting nozzle portion having a plurality of opening portions through which a gas flowing into the ventilation passage is supplied into the substrate storing space; and a gas flow rate uniformizing unit which enables the gas to flow out through the plurality of opening portions at a uniform flow rate.

In addition, it is preferable that the gas flow rate uniformizing unit is a gas retention chamber formed between the ventilation passage and the opening portions of the gas ejecting nozzle portion, and is configured by the gas retention chamber configuring a gas uniform holding portion in which the gas is temporarily accumulated and pressurized as the ventilation passage and the opening portions of the gas ejecting nozzle portion communicate with each other and thus the gas from the ventilation passage can be uniformly held in a predetermined amount. In addition, it is preferable that the gas flow rate uniformizing unit is a branch passage formed between the ventilation passage and the opening portions, and is configured by the branch passage which causes a flow of the gas from the ventilation passage to branch.

In addition, it is preferable that the wall portion includes a back wall, an upper wall, a lower wall, and a pair of side walls, the other end portion of the wall portion is closed by the back wall, and the container main body opening portion is formed by one end portion of the upper wall, one end portion of the lower wall, and one end portions of the side walls, the back wall has a projecting portion projecting toward the container main body opening portion, and the projecting portion has the opening portions and configures the gas ejecting nozzle portion.

In addition, it is preferable that the wall portion includes a back wall, an upper wall, a lower wall, and a pair of side walls, the other end portion of the wall portion is closed by the back wall, and the container main body opening portion is formed by one end portion of the upper wall, one end portion of the lower wall, and one end portions of the side walls, the gas ejecting nozzle portion is disposed at a center portion of the back wall, and the opening portions of the gas ejecting nozzle portion are open toward the container main body opening portion.

In addition, it is preferable that the gas ejecting nozzle portion has a cleaning solution inflow inhibiting portion which inhibits an inflow of a cleaning solution from the opening portions toward the ventilation passage side in the vicinity of the opening portions when the container main body is cleaned. In addition, it is preferable that the gas ejecting nozzle portion has a downward outflow portion that allows the gas from the opening portion to flow out in a lower direction.

In addition, it is preferable that in the gas ejecting nozzle portion, an area per unit area of a passage through which the gas passes in the opening portion on the lower side is larger than an area per unit area of a passage through which the gas passes in the opening portion on the upper side.

In addition, it is preferable that the opening portion is disposed at a position where the gas can flow to a space below the substrate stored at the lowermost side in the substrate storing space. In addition, it is preferable that the ventilation passage is formed any of outside the wall portion, inside the wall portion, or at a position of the wall portion.

In addition, it is preferable that the opening portions have a first opening portion which is open in a direction toward the container main body opening portion located at one end portion of the container main body, and a second opening portion which is open in a direction at a predetermined angle with respect to a direction opposite to the direction toward the container main body opening portion.

In addition, it is preferable that the first opening portion is formed to be open in a semicircular shape oriented in a direction toward the container main body opening portion, and the second opening portion is formed to be open in a fan-like shape oriented in a direction at an angle of 45° with respect to a direction opposite to the direction toward the container main body opening portion.

In addition, it is preferable that a radius of an opening portion having the fan-like shape of the second opening portion is larger than a radius of an opening portion having the semicircular shape of the first opening portion.

Effects of the Invention

According to the present invention, it is possible to provide a substrate storing container capable of reliably performing substitution of a gas in a substrate storing space.

PREFERRED MODE FOR CARRYING OUT THE INVENTION

Figure 1:
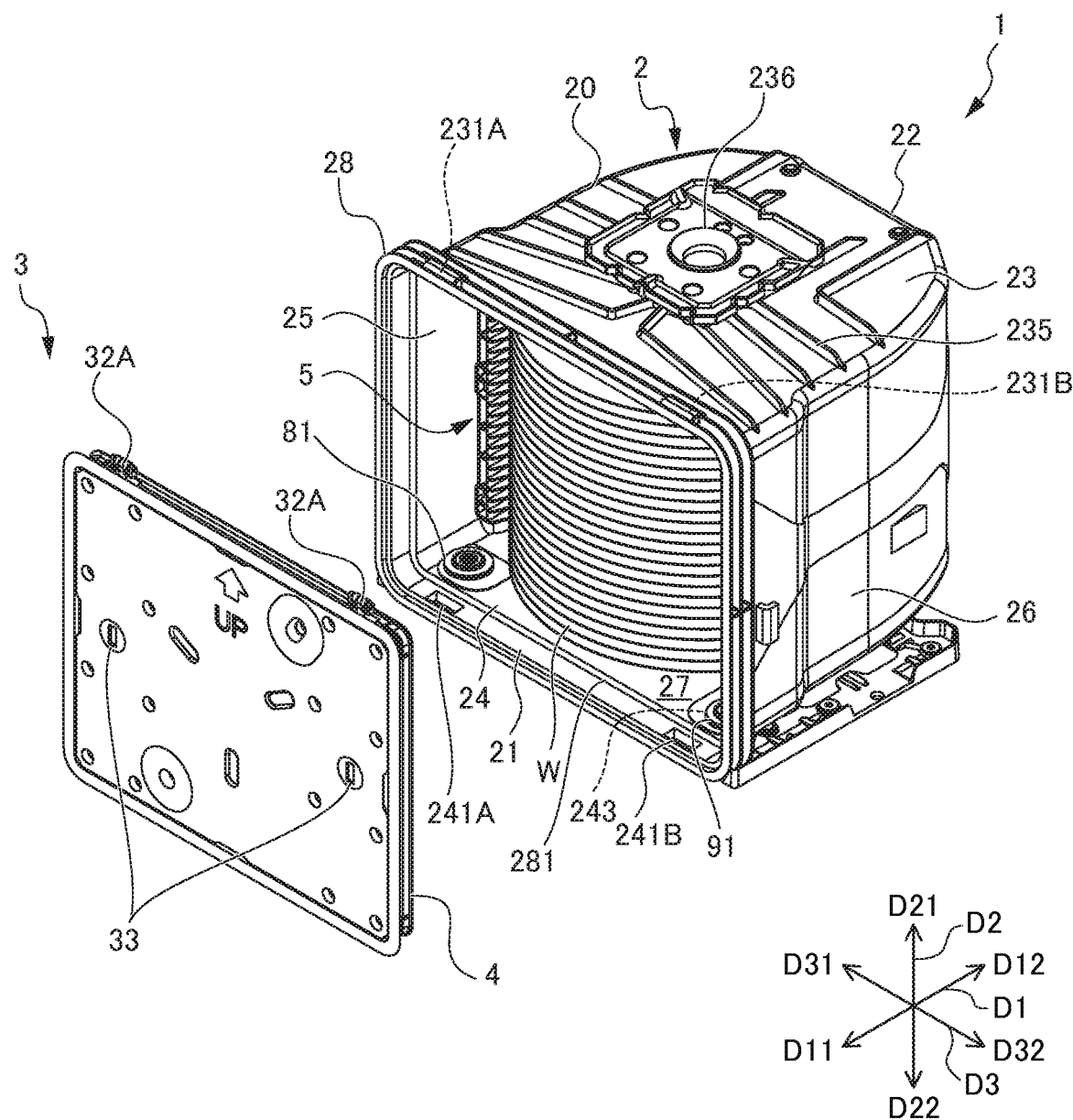
FIG. 1 is an exploded perspective view illustrating an aspect of a plurality of substrates W stored in a substrate storing container 1 according to a first embodiment of the present invention.
Figure 2:
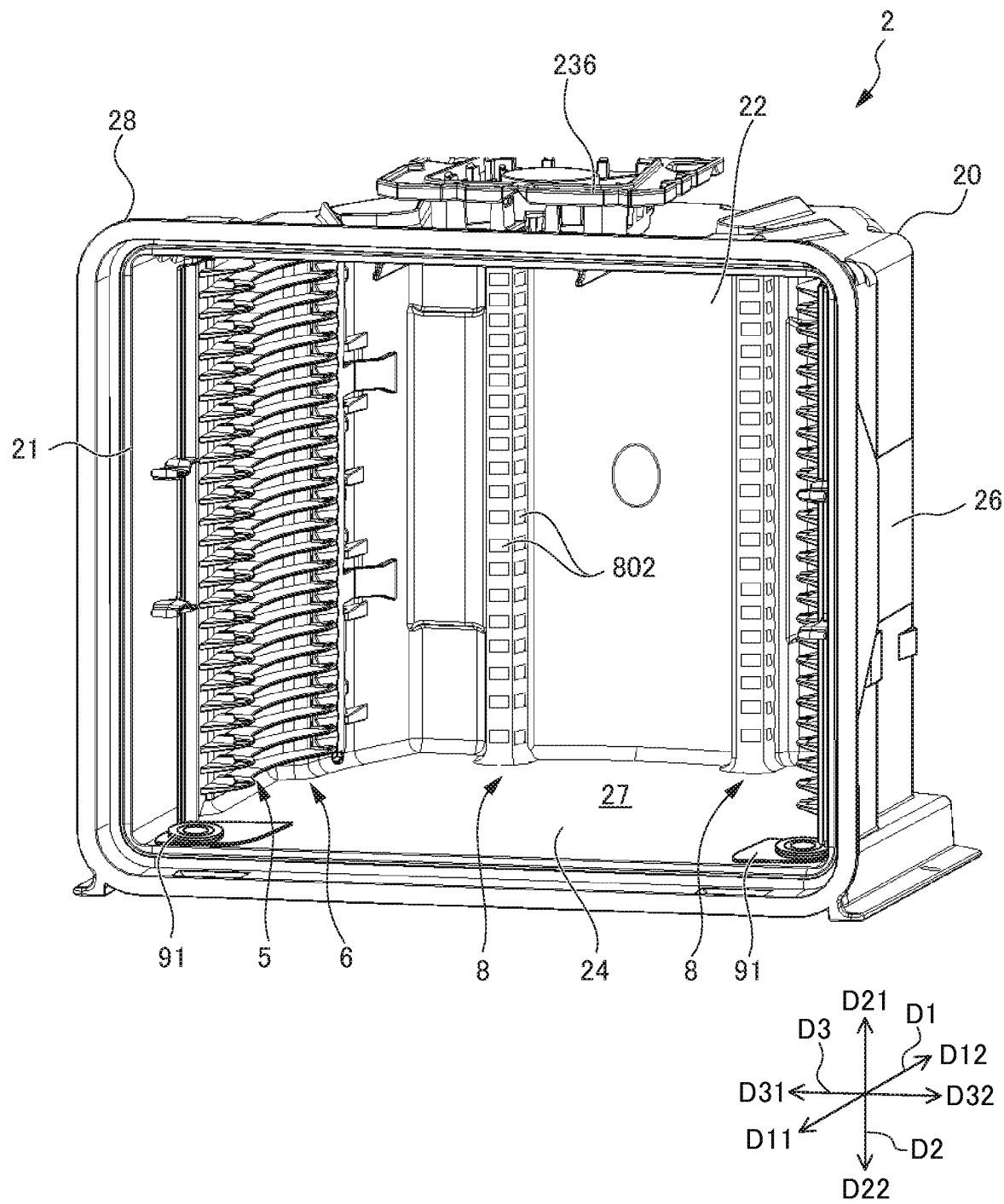
FIG. 2 is an upper perspective view illustrating a container main body 2 of the substrate storing container 1 according to the first embodiment of the present invention.
Figure 3:
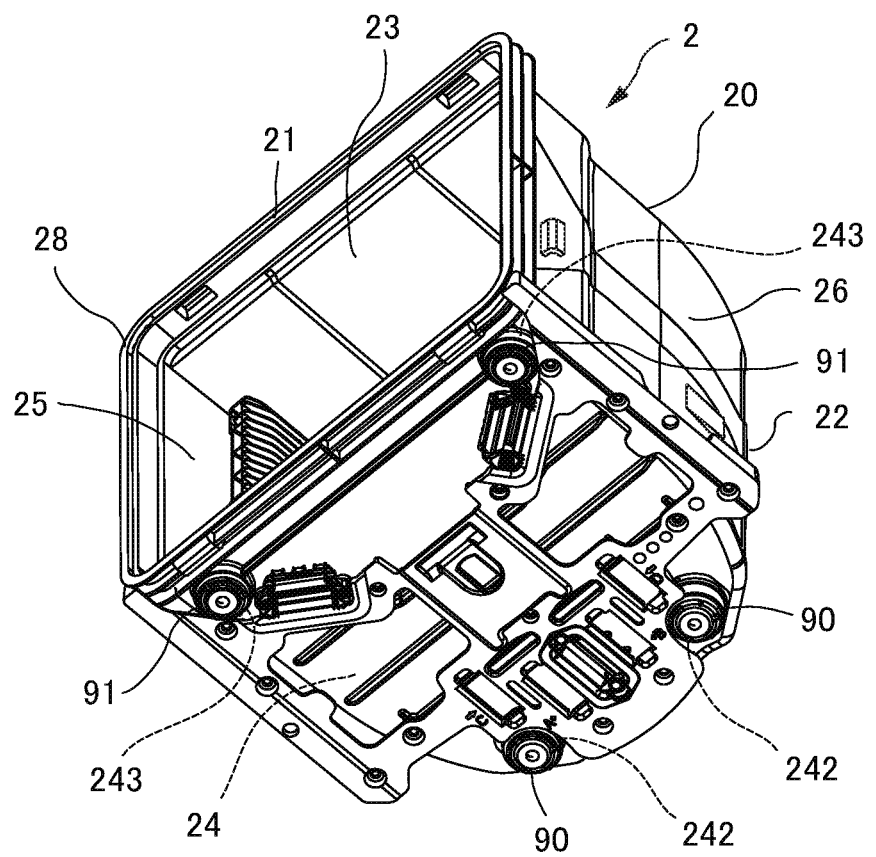
FIG. 3 is a lower perspective view illustrating the container main body 2 of the substrate storing container 1 according to the first embodiment of the present invention.
Figure 4:
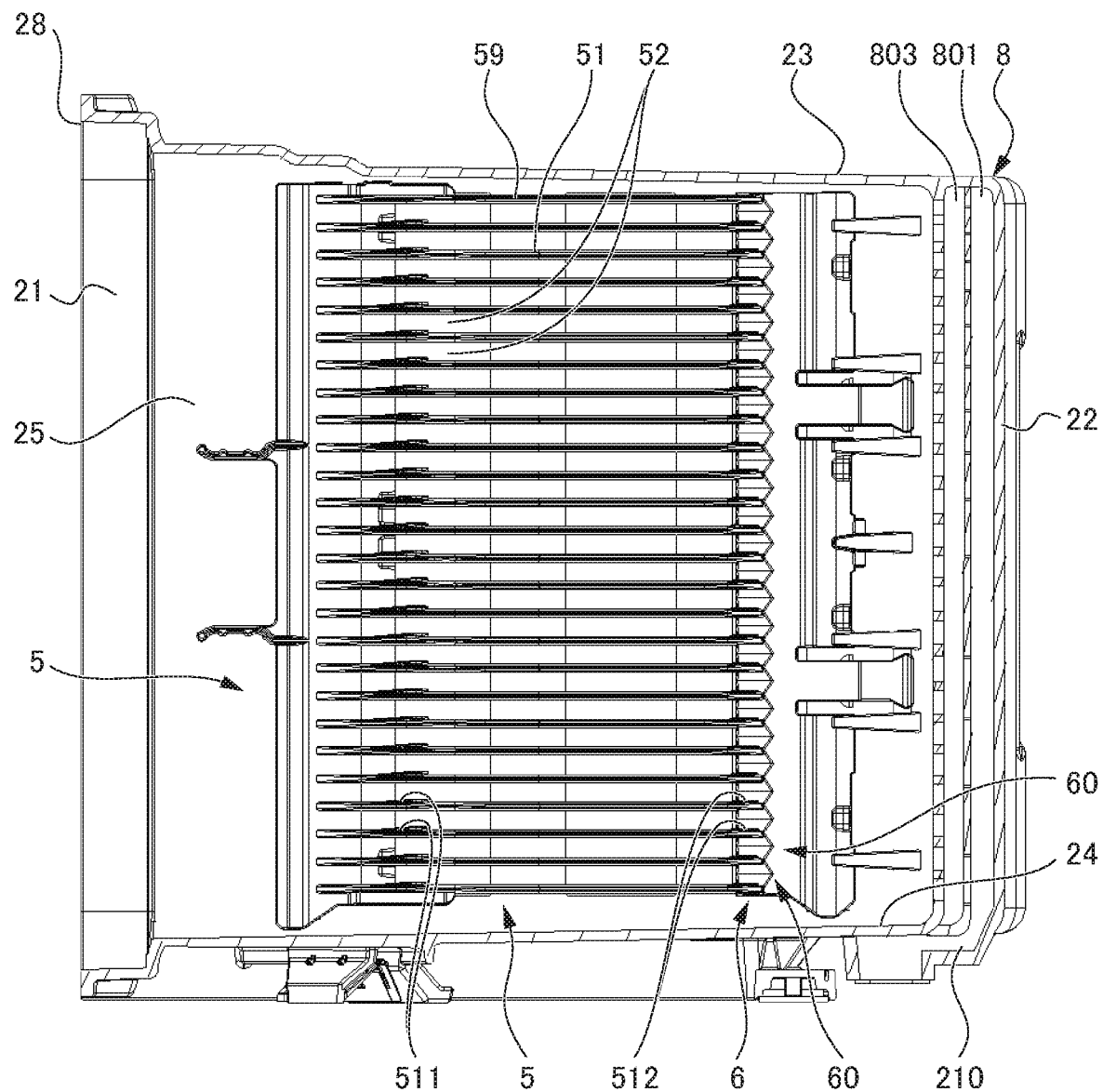
FIG. 4 is a lateral sectional view illustrating the container main body 2 of the substrate storing container 1 according to the first embodiment of the present invention.

In the following, a substrate storing container 1 according to a first embodiment is described with reference to the drawings. FIG. 1 is an exploded perspective view illustrating an aspect of a plurality of substrates W stored in the substrate storing container 1 according to the first embodiment of the present invention. FIG. 2 is an upper perspective view illustrating a container main body 2 of the substrate storing container 1 according to the first embodiment of the present invention. FIG. 3 is a lower perspective view illustrating the container main body 2 of the substrate storing container 1 according to the first embodiment of the present invention. FIG. 4 is a lateral sectional view illustrating the container main body 2 of the substrate storing container 1 according to the first embodiment of the present invention. Incidentally, in FIG. 4, for convenience, illustration of a supply filter portion 90, ribs 235, and a top flange 236 is omitted.

Herein, for the purpose of illustration, the direction from the container main body 2 toward a lid body 3 (direction from the upper right, toward the lower left in FIG. 1) is defined as a forward direction D11 and the direction opposite thereto is defined as a backward direction D12. These directions are collectively defined as a forward/backward direction D1. In addition, the direction from a lower wall 24 toward an upper wall 23, which will be described later, (upper direction in FIG. 1) is defined as an upper direction D21 and the direction opposite thereto is defined as a lower direction D22. These directions are collectively defined as an upper/lower direction D2. Moreover, the direction from a second side wall 26 toward a first side wall 25, which will be described later, (direction from the lower right to the upper left in FIG. 1) is defined as a left direction D31 and the direction opposite thereto is defined as a right direction D32. These directions are collectively defined as a left/right direction D3. In the main drawings, arrows indicating these directions are illustrated.

Furthermore, the substrate W stored in the substrate storing container 1 (see FIG. 1) is a disk-like silicon wafer, glass wafer, sapphire wafer, etc., and is a thin member used for industrial use. The substrate W in the present embodiment is a silicon wafer having a diameter of 300 mm.

As illustrated in FIG. 1, the substrate storing container 1 is used as a process container for storing the substrate W formed of a silicon wafer as described above and conveying the substrate W in a process in a factory, or as a shipment container for transporting substrates by transporting means such as land transporting means, air transporting means, or water transporting means, and is constituted by the container main body 2 and the lid body 3. The container main body 2 includes substrate support plate-like portions 5 as a lateral substrate support portion and back side substrate support portions 6 (see FIG. 2 and the like), and the lid body 3 includes a front retainer (not illustrated) as a lid body side substrate support portion.

The container main body 2 has a tubular wall portion 20 in which a container main body opening portion 21 formed at one end portion and the other end portion is closed. A substrate storing space 27 is formed in the container main body 2. The substrate storing space 27 is formed to be surrounded by the wall portion 20. The substrate support plate-like portion 5 is disposed at a part that is a portion of the wall portion 20 and forms the substrate storing space 27. A plurality of substrates W can be stored in the substrate storing space 27 as illustrated in FIG. 1.

The substrate support plate-like portions 5 are provided at the wall portion 20 so as to form a pair in the substrate storing space 27. When the container main body opening portion 21 is not closed by the lid body 3, the substrate support plate-like portions 5 can support the edge portions of the plurality of substrates W in a state in which adjacent substrates W are arranged in parallel to be spaced apart, by a predetermined interval by abutting the edge portions of the plurality of substrates W. The back side substrate support portions 6 are provided to be formed integrally with the substrate support plate-like portions 5 on the back side of the substrate support plate-like portions 5.

The back side substrate support, portions 6 (see FIG. 2 and the like) are provided at the wall portion 20 so as to form a pair with the front retainer (not illustrated), which will be described later, in the substrate storing space 27. When the container main body opening portion 21 is closed by the lid body 3, the back side substrate support portions 6 can support rear portions of the edge portions of the plurality of substrates W by abutting the edge portions of the plurality of substrates W.

The lid body 3 can be removably attached to an opening circumferential portion 28 (FIG. 1 and the like) forming the container main body opening portion 21 and can close the container main body opening portion 21. The front retainer (not illustrated) is a part of the lid body 3 and is provided at a portion which faces the substrate storing space 27 when the container main body opening portion 21 is closed by the lid body 3. The front retainer (not illustrated) is disposed so as to form a pair with the back side substrate support portion 6 inside the substrate storing space 27.

When the container main body opening portion 21 is closed by the lid body 3, the front retainer (not illustrated) can support front portions of the edge portions of the plurality of substrates W by abutting the edge portions of the plurality of substrates W. When the container main body opening portion 21 is closed by the lid body 3, the front retainer (not illustrated) retains the plurality of substrates W in a state in which adjacent substrates W are arranged in parallel to be spaced apart by a predetermined interval by supporting the plurality of substrates W in cooperation with the back side substrate support portions 6.

The substrate storing container 1 is made of a resin such as a plastic material, and unless otherwise described, examples of the resin of the material include thermoplastic resins such as polycarbonate, cycloolefin polymer, polyether imide, polyether ketone, polybutylene terephthalate, polyether ether ketone, and liquid crystal polymer, and alloys thereof. In the case of imparting conductivity, conductive substances such as carbon fibers, carbon powders, carbon nanotubes, and conductive polymers are selectively added to the resins of these forming materials. Furthermore, in order to increase rigidity, it is also possible to add glass fibers, carbon fibers, and the like.

Each portion is described in detail in the following. As illustrated in FIG. 1, the wall portion 20 of the container main body 2 includes a back wall 22, the upper wall 23, the lower wall 24, the first side wall 25, and the second side wall 26. The back wall 22, the upper wall 23, the lower wall 21, the first side wall 25, and the second side wall 26 are made of the above-mentioned material, and are configured so as to be integrally molded.

The first side wall 25 faces the second side wall 26, and the upper wall 23 faces the lower wall 24. A rear end of the upper wall 23, a rear edge of the lower wall 24, a rear end of the first side wall 25, and a rear end or the second side wall 26 are all connected to the back wall 22. A front end of the upper wall 23, a front end of the lower wall 24, a front end of the first side wall 25, and a front end of the second side wall 26 configure the opening circumferential portion 28 which forms the container main body opening portion 21 in a substantially rectangular shape.

The opening circumferential portion 28 is provided at one end portion of the container main body 2, and the back wall 22 is located at the other end portion of the container main body 2. The external shape of the container main body 2 formed by the outer faces of the wall portion 20 is a box shape. Inner faces of the wall portion 20, that is, an inner face of the back wall 22, an inner face of the upper wall 23, an inner face of the lower wall 24, an inner face of the first side wall 25, and an inner face of the second side wall 26, form the substrate storing space 27, which is surrounded thereby. The container main body opening portion 21 formed by the opening circumferential portion 28 is surrounded by the wall portion 20 and is in communication with the substrate storing space 27 formed inside the container main body 2. The substrate storing space 27 can store a maximum of twenty-five substrates W.

As illustrated in FIG. 1, latch engagement concave portions 231A, 231B, 241A, and 241B, which are concave outwardly from the substrate storing space 27, are formed at portions of the upper wall 23 and the lower wall 24 which are proximal to the opening circumferential portion 28. The latch engagement concave portions 231A, 231B, 241A, and 241B are respectively formed in the vicinities of both right and left end portions of the upper wall 23 and the lower wall 24. The total number thereof is four.

As illustrated in FIG. 1, ribs 235 are provided so as to be integrally formed with the upper wall 23 at an outer face of the upper wall 23. The ribs 235 increase the rigidity of the container main body 2. Furthermore, the top flange 236 is fixed at the center portion of the upper wall 23. The top flange 236 is a member which becomes a portion of the substrate storing container 1 from which it is hung to be suspended when suspending the substrate storing container 1 by an automated material handling system (AMHS), a person guided vehicle (PGV), etc.

As illustrated in FIG. 3, at four corners of the lower wall 24, as ventilation passages 210, supply holes 242 and exhaust holes 243, which are two types of through-holes, are formed. In the present embodiment, the through-holes at two points of the front portion of the lower wall 24 are the exhaust holes 243 through which the gas inside the container main body 2 is discharged, and the through-holes at two points of the rear portion thereof are the supply holes 242 through which the gas is supplied into the container main body 2. The supply filter portion 90 is disposed in the through-hole as the supply hole 242, and an exhaust filter portion 91 is disposed in the through-hole as the exhaust hole 243. Therefore, passages for the gas inside the supply filter portion 90 and the exhaust filter portion 91 configure a portion of the ventilation passage 210 which enables the substrate storing space 27 and the space outside the container main body 2 to communicate with each other. In addition, the supply filter portion 90 and the exhaust filter portion 91 are disposed in the wall portion 20, and through the supply filter portion 90 and the exhaust filter portion 91, the gas can pass between the space outside the container main body 2 and the substrate storing space 27.

The substrate support plate-like portions 5 are interior components which are provided at the first side wall 25 and the second side wall 26, respectively, and are arranged in the substrate storing space 27 so as to form a pair in the left/right direction D3. Specifically, as illustrated in FIG. 4 and the like, the substrate support plate-like portion 5 includes a plate portion 51, and a support wall 52 as a plate portion support portion. The plate portion 51 and the support wall 52 are configured to be integrally formed by a resin material. The plate portion 51 is supported by the support wall 52.

The plate portion 51 has a substantially plate-like arc shape. Twenty-five of the plate portions 51 are provided at each of the first side wall 25 and the second side wall 26 in the upper/lower direction D2. The total number of the plate portions 51 is fifty. The adjacent plate portions 51 are arranged so as to be spaced apart in the upper/lower direction D2 by an interval of 10 mm to 12 mm in a parallel positional relations. Incidentally, a plate-like member 59 parallel to one plate portion 51 is disposed above the plate portion 51 located at the top. The member 59 is a member that is located at the top and serves as a guide with respect to the substrate W when the substrate W is inserted into the substrate storing space 27.

Furthermore, the twenty-five plate portions 51 provided at the first side wall 25 and the twenty-five plate portions 51 provided at the second side wall 26 have a positional relationship opposite to each other in the left/right direction D3. Furthermore, the fifty plate portions 51 and the member 59 that serves as a plate-like guide parallel to the plate portion 51 have a positional relationship parallel to an inner face of the lower wall 24. Convex portions 511 and 512 are provided at an upper face of the plate portion 51. The substrate W supported by the plate portion 51 is only in contact with a projecting edge of the convex portions 511 and 512, and does not contact with the face of the plate portion 51.

The support wall 52 has a plate shape extending in the upper/lower direction D2 and substantially in the forward/backward direction D1. As illustrated in FIG. 4, the support wall 52 has a predetermined length in the longitudinal direction of the plate portion 51 and is connected to a side end edge of the plate portion 51. The plate-like support wall 52 is curved toward the substrate storing space 27 along the outer side end edge of the plate portion 51.

That is, the twenty-five plate portions 51 provided at the first side wall 25 are connected to the support wall 52 provided at the first side wall 25 side. Similarly, the twenty-five plate portions 51 provided at the second side wall 26 are connected to the support wall 52 provided at the second side wall 26 side. The support wall 52 is fixed to each of the first side wall 25 and the second side wall 26.

With the substrate support plate-like portions 5 of such a configuration, it is possible to support the edge portions of the plurality of substrates W in a state in which the adjacent substrates W among the plurality of substrates W are arranged to be spaced apart by a predetermined interval in a parallel positional relationship.

As illustrated in FIG. 4, the back side substrate support portion 6 has back side end edge support portions 60. The back side end edge support portions 60 are integrally formed with the plate portions 51 and the support wall 52 at rear end portions of the plate portions 51 of the substrate support plate-like portion 5. Therefore, the substrate support plate-like portions 5 as the lateral substrate support portion and the back side substrate support portions 6 configure a single interior component fixed and joined to the container main body 2 inside the container main body 2. Incidentally, the back side substrate support portion 6 may be configured so as to be separated from the substrate support plate-like portion 5. In other words, the back side end edge support portion 60 may be configured so as to be separated from the plate portion 51 of the substrate support plate-like portion 5.

The back side end edge support portions 60 are provided in a number, specifically, twenty-five, so as to respectively correspond to the substrates W that can be stored in the substrate storing space 27. The back side end edge support portions 60 provided at the first side wall 25 and the second side wall 26 have a positional relationship that forms a pair with the front retainer (not illustrated), which will be described later, in the forward/backward direction D1. As the substrates W are stored in the substrate storing space 27 and the lid body 3 is closed, the back side end edge support portions 60 pinch and support the end edges of the edge portions of the substrates W.

Figure 6:
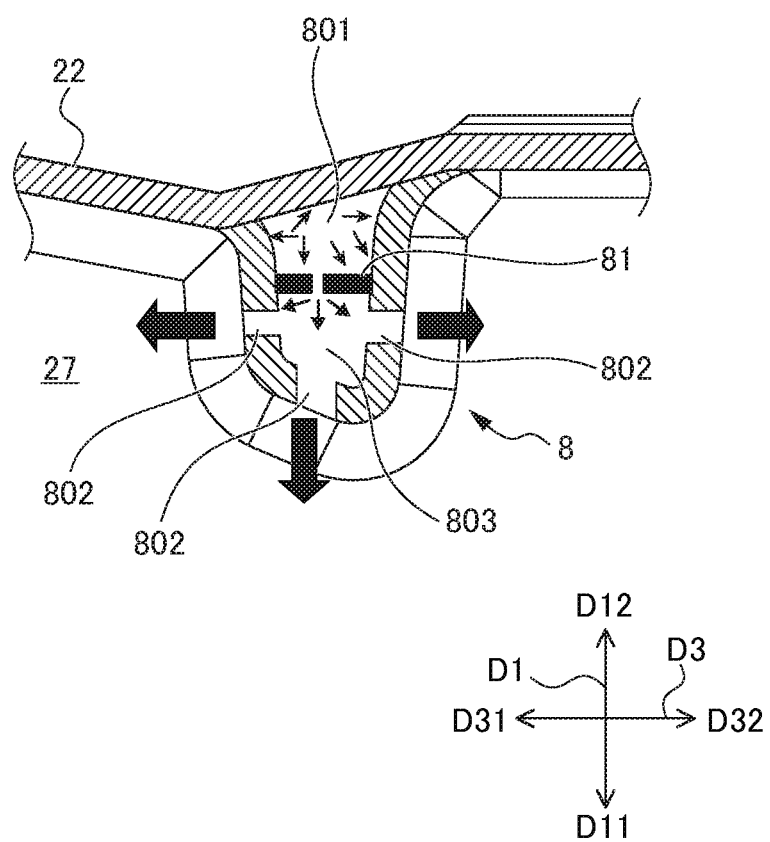
FIG. 6 is an enlarged upper sectional view illustrating a projecting portion 8 of the substrate storing container 1 according to the first embodiment of the present invention.

As illustrated in FIG. 2 and the like, the back wall 22 has projecting portions 8 as a gas ejecting nozzle portion. Two projecting portions 8 form a pair, project toward the container main body opening portion 21 in a rib shape, and extend in parallel from the upper end portion to the lower end portion of the back wall 22. That is, the projecting portion 8 has a hollow columnar shape. The internal space of the projecting portion 8 is partitioned into a front space and a rear space by a partition wall portion 81 (see FIG. 6). FIG. 6 is an enlarged upper sectional view illustrating the projecting portion 8 of the substrate storing container 1 according to the first embodiment of the present invention.

Figure 5:
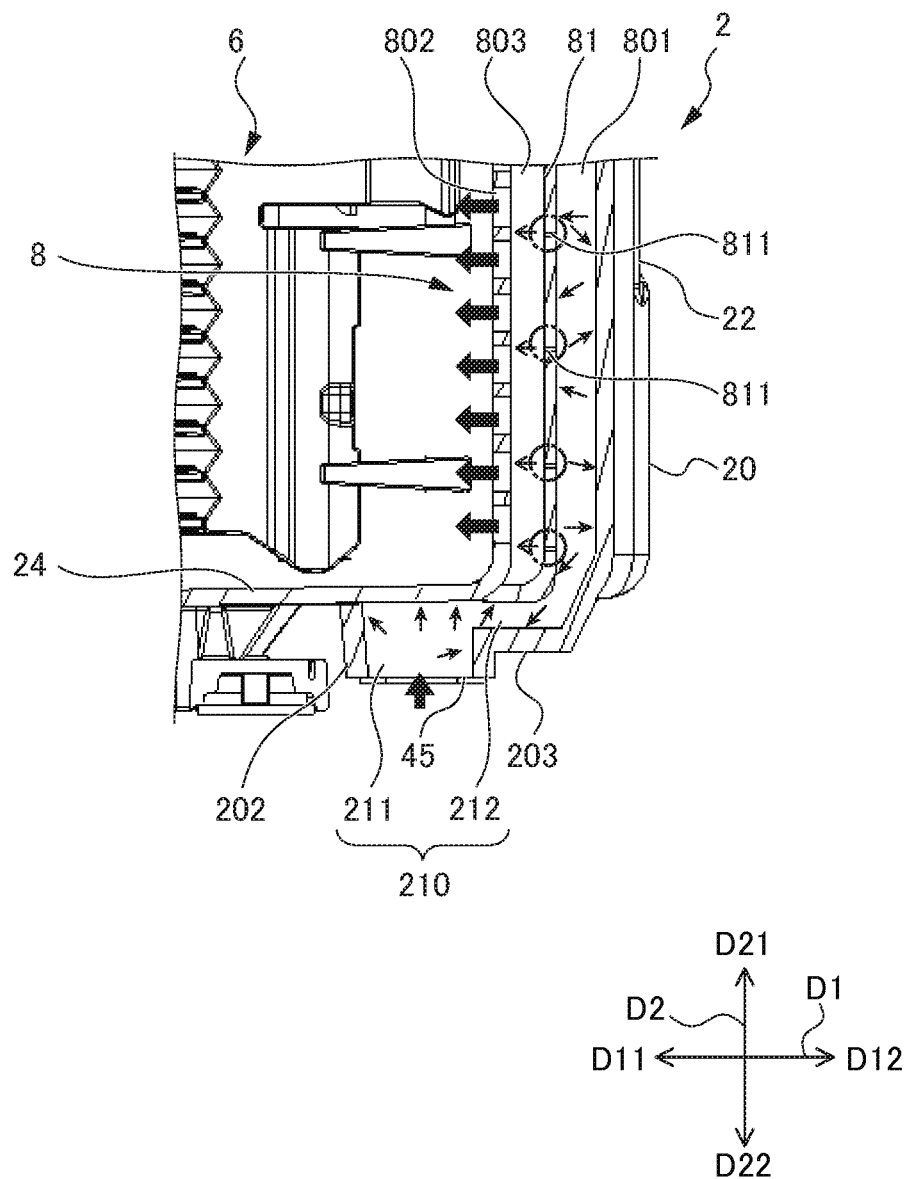
FIG. 5 is an enlarged lateral sectional view illustrating the container main body 2 of the substrate storing container 1 according to the first embodiment of the present invention.

The front space configures a gas pre-outflow holding chamber 803, and the rear space configures a gas retention chamber 801 which communicates with the ventilation passage 210 (see FIG. 5 and the like) which enables the substrate storing space 27 and the space outside the container main body 2 to communicate with each other. FIG. 5 is an enlarged lateral sectional view illustrating the container main body 2 of the substrate storing container 1 according to the first embodiment of the present invention. Incidentally, in FIG. 5, for convenience, illustration of the supply filter portion 90 is omitted. The projecting portion 8 has a plurality of opening portions 802 through which the gas flowing into the ventilation passage 210 is supplied into the substrate storing space 27. The gas retention chamber 801 is a gas uniform holding portion in which the purge gas is temporarily accumulated and pressurized and thus the gas from the ventilation passage 210 can be uniformly held in a predetermined amount between the ventilation passage 210 and the opening portions 802 of the projecting portion 8, and configures the gas uniform holding portion configuring a gas flow rate uniformizing unit which enables the purge gas to flow out through the plurality of opening portions 802 at a uniform flow rate.

An inert gas such as nitrogen as a gas, dry air from which moisture is removed (to 1% or less) (hereinafter, referred to as purge gas), or the like can pass through the ventilation passage 210. As illustrated in FIG. 5, the ventilation passage 210 has a gas inflow portion 211 and a horizontal extension portion 212, and the lower end portion of the gas retention chamber 801 is connected to the horizontal extension portion 212.

The gas inflow portion 211 is formed by an internal space of a cylindrical gas supply device connection portion 202 which is formed at the rear end portion of the lower wall 24 and projects in the lower direction D22 to form the supply hole 242. The horizontal extension portion 212 extends outside the lower wall 24 along the outer face (lower face) of the lower wall 24 in the backward direction D12 from the upper end portion of the gas inflow portion 211, and is formed by a space between the outer face of the lower wall 24 and a lower flow passage forming portion 203 projecting downward from the lower wall 24. In addition, the gas retention chamber 801 connected to the horizontal extension portion 212 is formed by a space on the rear side of the projecting portion 8 as described above, and extends from the rear end portion of the horizontal extension portion 212 to the upper end portion of the back wall 22 in the upper direction D21.

Minute inflow ports 811 into which the purge gas flows from the gas retention chamber 801 are formed in the partition wall portion 81. A large number of inflow ports 811 are formed, and the total area of the inflow ports 811 is smaller than the total area of the opening portions 802.

Figure 7:
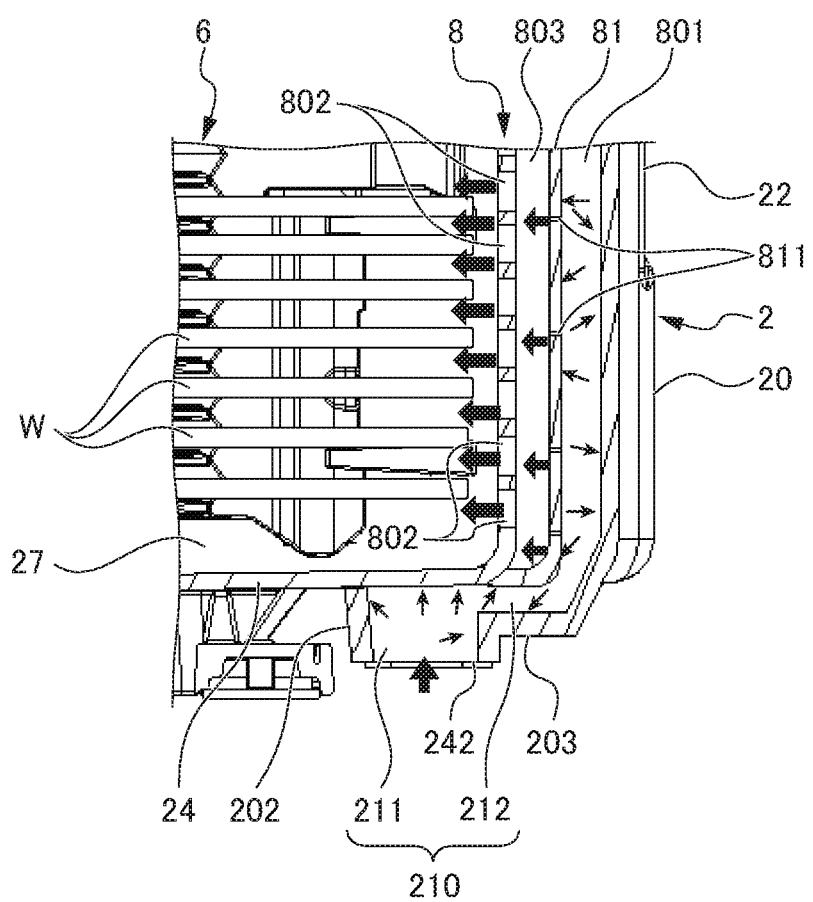
FIG. 7 is an enlarged lateral sectional view illustrating the flow of a purge gas in the container main body 2 of the substrate storing container 1 according to the first embodiment of the present invention.

As illustrated in FIG. 7, the lowermost opening portion 802 among the plurality of opening portions 802 is disposed below the substrate W stored at the lowermost side in the substrate storing space 27, and faces a space below the substrate W stored at the lowermost side. In the gas retention chamber 801 as the gas uniform holding portion, since the purge gas from the ventilation passage 210 is uniformly held in a predetermined amount, even from the opening portion 802 at a low position at the lower side as described above, the purge gas can flow out at a sufficient flow rate. In addition, the opening portion 802 has a positional relationship that faces a space between adjacent substrates W among the plurality of substrates stored in the substrate storing space 27, and the opening portion 802 located at the top faces a space above the substrate W stored at the top. FIG. 7 is an enlarged lateral sectional view illustrating the flow of the purge gas in the container main body 2 of the substrate storing container 1 according to the first embodiment of the present invention. Incidentally, in FIG. 7, for convenience, illustration of the supply filter portion 90 is omitted.

As illustrated in FIG. 1 and the like, the lid body 3 has a substantially rectangular shape which substantially matches the shape of the opening circumferential portion 28 of the container main body 2. The lid body 3 is removably attached to the opening circumferential portion 28 of the container main body 2. By the lid body 3 being attached to the opening circumferential portion 28, the lid body 3 can close the container main body opening portion 21. An annular sealing member 4 is attached to, in the inner face of the lid body 3 (a face on the rear side of the lid body 3 illustrated in FIG. 1), a face facing a face of a stepped portion (sealing face 281) formed at a position immediately behind the opening circumferential portion 28 in the backward direction D12 when the lid body 3 closes the container main body opening portion 21. The sealing member 4 is made of various thermoplastic elastomers such as elastically deformable polyesters and polyolefins, fluororubber, silicon rubber, and the like. The sealing member 4 is disposed so as to go around the outer circumferential portion of the lid body 3.

When the lid body 3 is attached to the opening circumferential portion 28, the sealing member 4 is elastically deformed by being sandwiched between the sealing face 281 and the inner face of the lid body 3 such that the lid body 3 closes the container main body opening portion 21 in a sealed state. As the lid body 3 is detached from the opening circumferential portion 28, the substrates W can be taken in and out from the substrate storing space 27 in the container main body 2.

In the lid body 3, a latch mechanism is provided. The latch mechanism is provided in the vicinity of both left and right end portions of the lid body 3, and as illustrated in FIG. 1, includes two upper latch portions 32A that can project from the upper edge of the lid body 3 in the upper direction D21, and two lower latch portions (not illustrated) that can project from the lower edge of the lid body 3 in the lower direction D22. The two upper latch portions 32A are disposed in the vicinity of both left and right ends of the upper edge of the lid body 3, and the two lower latch portions are disposed in the vicinity of both left and right ends of the lower edge of the lid body 3.

An operation portion 33 is provided on the outer face of the lid body 3. By operating the operation portion 33 from the front side of the lid body 3, the upper latch portions 32A and the lower latch portions (not illustrated) can be caused to project from the upper edge and the lower edge of the lid body 3 and can be caused to be in a state of not projecting from the upper edge and the lower edge. The upper latch portions 32A project from the upper edge of the lid body 3 in the upper direction D21 and are engaged with latch engagement concave portions 231A and 231B of the container main body 2, and the lower latch portions (not illustrated) project from the lower edge of the lid body 3 in the lower direction D22 and are engaged with latch engagement concave portions 241A and 241B of the container main body 2, whereby the lid body 3 is fixed to the opening circumferential portion 28 of the container main body 2.

Inside the lid body 3, a concave portion (not illustrated) which is concave outwardly from the substrate storing space 27 is formed. The front retainer (not illustrated) is provided to be fixed to the concave portion (not illustrated) and a part of the lid body 3 outside the concave portion.

The front retainer (not illustrated) has front retainer substrate receiving portions (not illustrated). Two front retainer substrate receiving portions are disposed so as to be spaced apart at a predetermined interval in the left/right direction D3 and form a pair. Twenty-five pairs of the front retainer substrate receiving portions disposed in pairs as described above are provided in parallel in the upper/lower direction D2. As the substrates W are stored in the substrate storing space 27 and the lid body 3 is closed, the front retainer substrate receiving portions sandwich and support the end edges of the edge portions of the substrates W therebetween.

In the substrate storing container 1 as described above, gas purge (substitution of the gas) by the purge gas is performed as follows. First, the supply filter portion 90 (see FIG. 3) provided in the gas supply device connection portion 202 (see FIG. 5) is connected to a supply nozzle of a gas supply device (not illustrated) that supplies the purge gas as the gas. Next, the purge gas is supplied to the ventilation passage 210 from the supply nozzle of the gas supply device. Accordingly, the purge gas passes through the gas inflow portion 211 and the horizontal extension portion 212 of the ventilation passage 210, flows into the gas retention chamber 801 from the lower end portion of the gas retention chamber 801, and vigorously flows toward the upper end portion of the gas retention chamber 801. In addition, as indicated by arrows in FIG. 5, the purge gas is temporarily accumulated in the gas retention chamber 801 and increased in pressure, and then flows from the inflow ports 811 of the partition wall portion 81 to the gas pre-outflow holding chamber 803.

At this time, since the inflow ports 811 are small, the purge gas flows into the gas pre-outflow holding chamber 803 from the inflow ports 811 with weak momentum. Then, the purge gas is primarily accumulated in the gas pre-outflow holding chamber 803. Then, the purge gas primarily accumulated and pressurized as described above gradually flows out from the opening portions 802 to the substrate storing space 27.

According to the substrate storing container 1 according to the present embodiment having the above-described configuration, the following effects can be obtained. As described above, the substrate storing container 1 includes: the container main body 2 which includes the tubular wall portion 20 in which one end portion has the opening circumferential portion 28 at which the container main body opening portion 21 is formed and the other end portion is closed, and has the substrate storing space 27 formed by the inner faces of the wall portion 20, the substrate storing space being able to store a plurality of substrates W and communicating with the container main body opening portion 21; the lid body 3 which is removably attached to the container main body opening portion 21 and is able to close the container main body opening portion 21; the ventilation passage 210 which enables the substrate storing space 27 and a space outside the container main body 2 to communicate with each other; and the projecting portion 8 as the gas ejecting nozzle portion having the plurality of opening portions 802 through which the purge gas flowing into the ventilation passage 210 is supplied into the substrate storing space 27. The substrate storing container 1 has the gas flow rate uniformizing unit (the gas retention chamber 801) which enables the gas to flow out through the plurality of opening portions 802 at a uniform flow rate.

In a case where the gas flow rate uniformizing unit is not provided, at the lower portion of the projecting portion 8, the purge pas flows out into the container main body 2 due to the Bernoulli phenomenon and the air inside the container main body 2 is drawn, so that a problem that substitution cannot be easily performed, that is, a problem that the purge gas vigorously flowing into the ventilation passage 210 flows into a passage corresponding to the gas retention chamber 801, and vigorously flows out from the upper end portion of the passage to the substrate storing space 27 but not vigorously flows out from the lower end portion of the passage to the substrate storing space 27 has conventionally been incurred. However, since the purge gas from the ventilation passage 210 is uniformly held in the gas retention chamber 801 in a predetermined amount, such a problem can be solved.

In addition, the gas flow rate uniformizing unit is the gas retention chamber 801 formed between the ventilation passage 210 and the opening portions 802 of the projecting portion 8 as the gas ejecting nozzle portion, and is configured by the gas retention chamber 801 configuring the gas uniform holding portion in which the gas from the ventilation passage 210 is temporarily accumulated and pressurized and thus the gas from the ventilation passage 210 can be uniformly held in a predetermined amount.

With the above configuration, the purge gas flowing from the ventilation passage 210 into the gas retention chamber 801 is temporarily accumulated in the gas retention chamber 801 such that the momentum of the flow is suppressed. Therefore, it is possible to suppress the purge gas vigorously flowing toward the upper end portion of the projecting portion 8 from flowing from the opening portions 802 of at the upper end portion of the projecting portion 8 into the substrate storing space 27 while maintaining the momentum. In addition, it is possible to suppress the gas in the substrate storing space 27 from being drawn into the projecting portion 8 by the Bernoulli phenomenon in the opening portions 802 at the lower end portion of the projecting portion 8 through which the purge gas vigorously passes.

In addition, the wall portion 20 includes the back wall 22, the upper wall 23, the lower wall 24, and the pair of side walls 25 and 26, the other end portion of the wall portion 20 is closed by the back wall 22, and the container main body opening portion 21 is formed by one end portion of the upper wall 23, one end portion of the lower wall 24, and one end portions of the side walls 25 and 26. The back wall 22 has the projecting portion 8 projecting toward the container main body opening portion 21. The projecting portion 8 has the opening portions 802 and configures the gas ejecting nozzle portion.

With the above configuration, the back wall 22 has the projecting portion 8 projecting from the back wall 22, and a space in which the air going around between the back wall 22 and the projecting portion 8 is present is not formed between the back wall 22 and the projecting portion 8. Therefore, the air between the back wall 22 and the projecting portion 8 is not entrained and stirred during substitution of the gas with the purge gas. As a result, it is possible to efficiently perform substitution of the gas.

In addition, it is not necessary to attach components such as a diffuser, which is a substantially cylindrical gas ejecting nozzle portion, to the substrate storing space 27, so that it is also possible to improve the cleanliness and the dryness at the time of cleaning the container main body 2. Furthermore, there are various regulations and standards for the substrate storing container 1 for semiconductors, and the dimensional restrictions in the container are severe. However, since the projecting portion 8 is provided on the back wall 22, such regulations and standards can be easily satisfied.

In addition, the opening portion 802 is disposed at a position where the purge gas can flow to a space below the substrate W stored at the lowermost side in the substrate storing space 27. With this configuration, it is possible to prevent the purge gas such as nitrogen, which is lighter than air, from not flowing to the space below the substrate stored at the lowermost side in the substrate storing space 27.

In addition, the ventilation passage 210 is formed outside the wall portion 20. With this configuration, even in a case where the ventilation passage 210 cannot be secured inside the wall portion 20, the ventilation passage 210 can be secured outside the wall portion 20. That is, it is possible to adopt an optimal configuration depending on the restrictions on an apparatus that handles the substrate storing container 1, the substrate storing container 1, and a manufacturing method of the substrate storing container 1, and it is possible to improve the degree of freedom of the substrate storing container 1 side.

Figure 8:
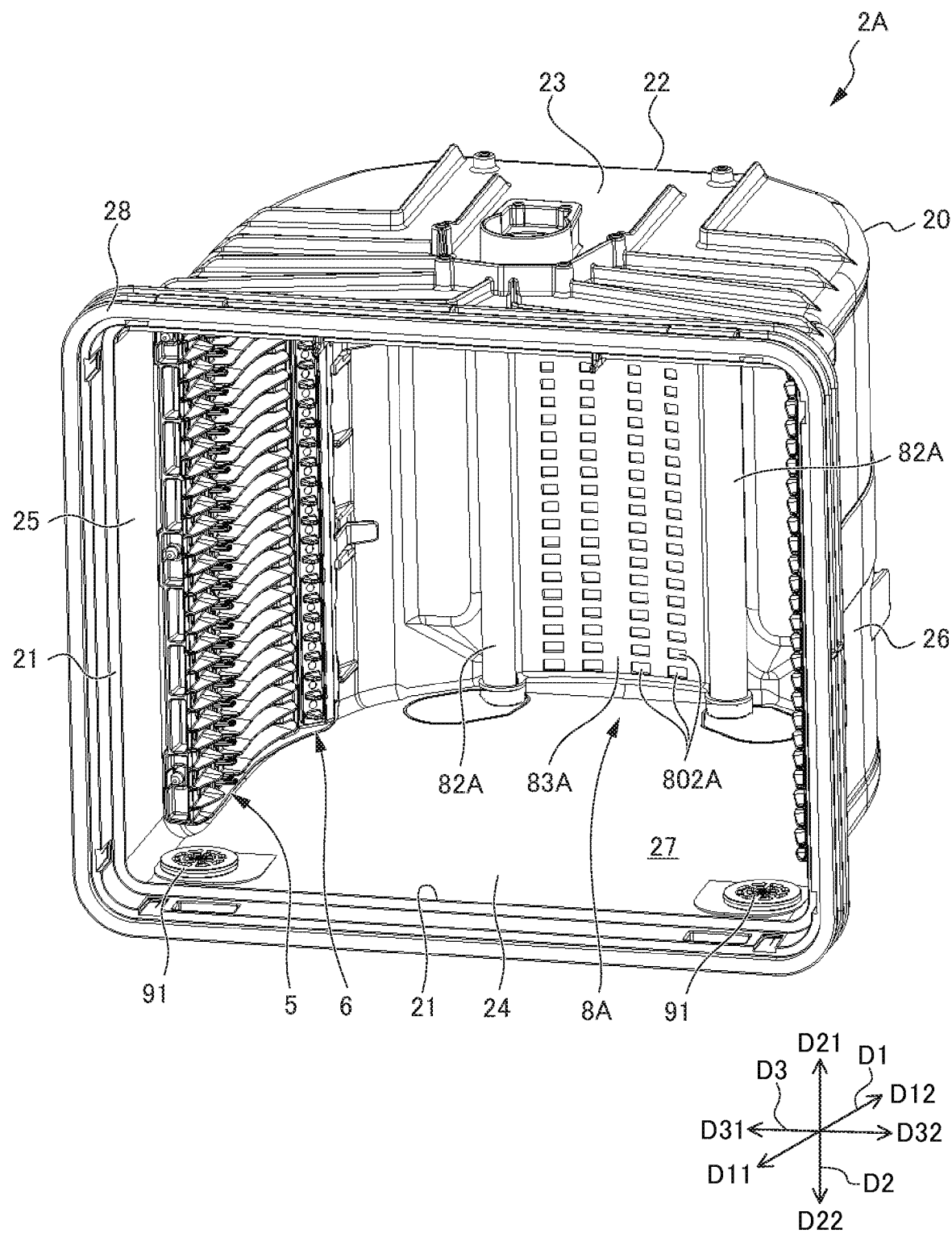
FIG. 8 is an upper perspective view illustrating a container main body 2A of a substrate storing container according to a second embodiment of the present invention.
Figure 9:
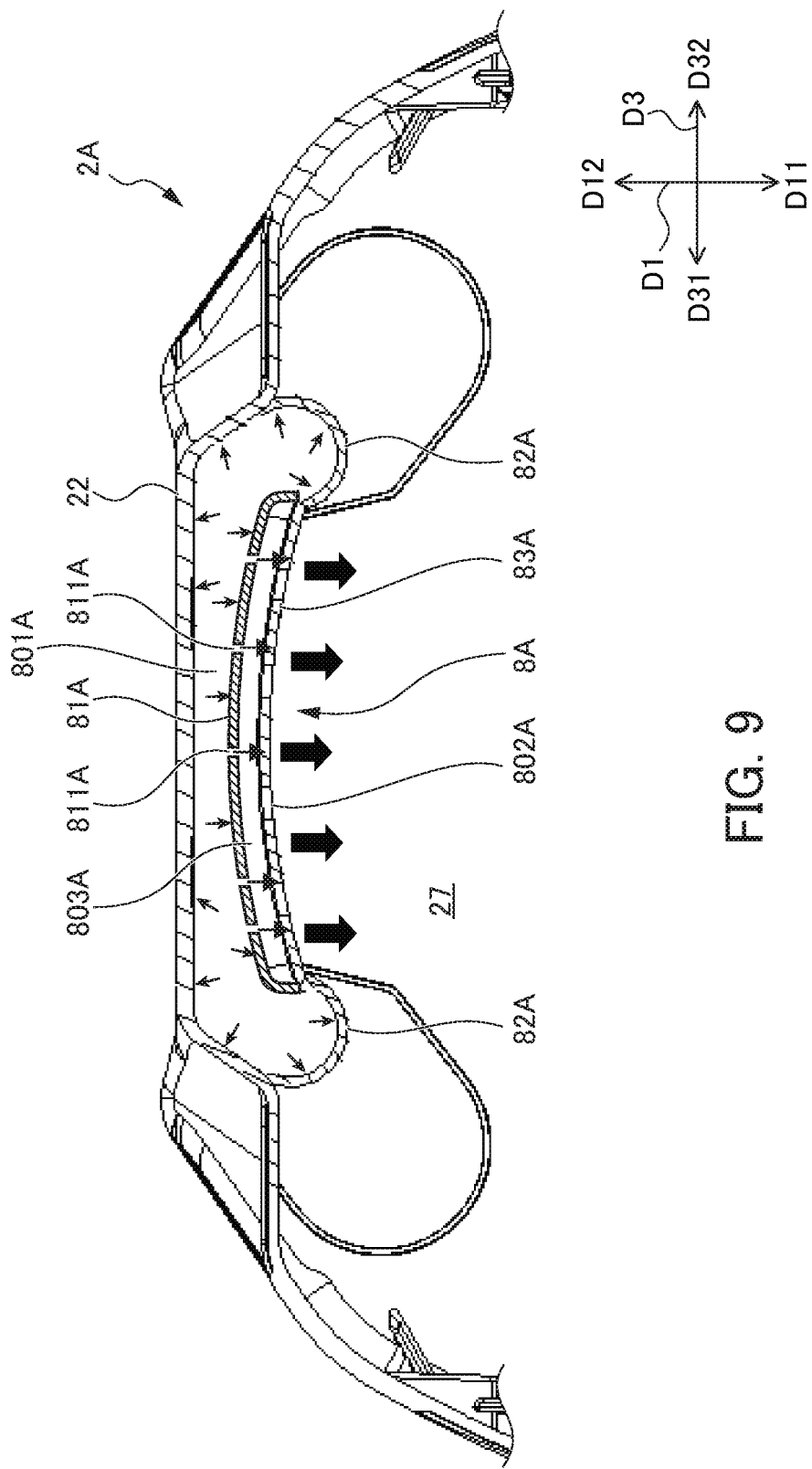
FIG. 9 an upper sectional view illustrating a back wall side nozzle portion 8A of the substrate storing container according to the second embodiment of the present invention.

Next, a substrate storing container according to a second embodiment of the present invention will be described with reference to the drawings. FIG. 8 is an upper perspective view illustrating a container main body 2A of the substrate storing container according to the second embodiment of the present invention. FIG. 9 is an upper sectional view illustrating a back wall side nozzle portion 8A of the substrate storing container according to the second embodiment of the present invention. Incidentally, in FIG. 8, for convenience, illustration of the top flange 236 is omitted.

In the second embodiment, the configuration of the gas ejecting nozzle portion is different from the configuration of the projecting portion 8 configuring the gas ejecting nozzle portion of the first embodiment. Since other configurations are the same as those of the first embodiment, like elements are denoted by like reference numerals, and description thereof will be omitted.

As illustrated in FIG. 8, the back wall 22 does not have the projecting portion 8. The back wall 22 is provided with the back wall side nozzle portion 8A as the gas ejecting nozzle portion. As illustrated in FIG. 9, the back wall side nozzle portion 8A has a pair of substantially cylindrical wall portions 82A and a center wall portion 83A, which are integrally molded. Specifically, the center wall portion 83A has a curved surface with a larger radius of curvature which is convex in the backward direction D12, and is disposed to face a part of about ⅓ of the center portion of the back wall 22 in the left/right direction D3. Opening portions 802A are formed in the center wall portion 83A.

A plurality of rows of the opening portions 802A are formed in the center wall portion 83A in the left/right direction D3. In each of the rows, a plurality of the opening portions 802A are formed in the upper/lower direction D2. The widths of the opening portions 802A in the upper/lower direction D2 and the widths of the opening portions 802A in the left/right direction D3 gradually decrease in the upper direction D21. That is, in the back wall side nozzle portion 8A, the area per unit area of a passage through which the purge gas passes in the opening portion 802A on the lower side is larger than the area per unit area of a passage through which the purge gas passes in the opening portion 802A on the upper side. The opening portions 802A are open toward the container main body opening portion 21, that is, in the forward direction D11.

A partition wall portion 81A is provided on the rear side of the center wall portion 83A. The partition wall portion 81A is disposed to be located between the center wall portion 83A and the back wall 22, and is connected to the center wall portion 83A. A space between the partition wall portion 81A and the back wall 22 configures a gas retention chamber 801A. A large number of inflow ports 811A are formed in the partition wall portion 81A. The total area of the inflow ports 811A is smaller than the total area of the opening portions 802A.

The pair of substantially cylindrical wall portions 82A is integrally connected to both end portions of the center wall portion 83A in the left/right direction D3, respectively, and are connected to the back wall 22. Accordingly, an internal space of the substantially cylindrical wall portions 82A and the space between the back wall 22 and the partition wall portion 81A communicate with each other and form a single space, and the single space configures the gas retention chamber 801A.

According to the substrate storing container according to the present embodiment having the above-described configuration, the following effects can be obtained. As described above, in the substrate storing container 1, the wall portion 20 includes the back wall 22, the upper wall 23, the lower wall 24, and the pair of side walls 25 and 26, the other end portion of the wall portion 20 is closed by the back wall 22, and the container main body opening portion 21 is formed by one end portion of the upper wall 23, one end portion of the lower wall 24, and one end portions of the side walls 25 and 26. The back wall side nozzle portion 8A configuring the gas ejecting nozzle portion is disposed at the center portion of the back wall 22. The opening portions 802A of the gas ejecting nozzle portion are open toward the container main body opening portion 21.

With the above configuration, utilizing a part of the substrate storing space 27 which faces the back wall 22 and is located in the vicinity of the back wall 22, the back wall side nozzle portion 8A as the gas ejecting nozzle portion is disposed, so that it is possible to supply the purge gas to the substrate storing space 27.

In the back wall side nozzle portion 8A as the gas ejecting nozzle portion, the area per unit area of the passage through which the purge gas passes in the opening portion 802A on the lower side is larger than the area per unit area of the passage through which the purge gas passes in the opening portion 802A on the upper side. With this configuration, it is possible to easily cause the flow rate of the purge gas from the opening portion 802A on the lower side in the back wall side nozzle portion 8A to be larger than the flow rate of the purge gas from the opening portion 802A on the upper side.

Figure 10:
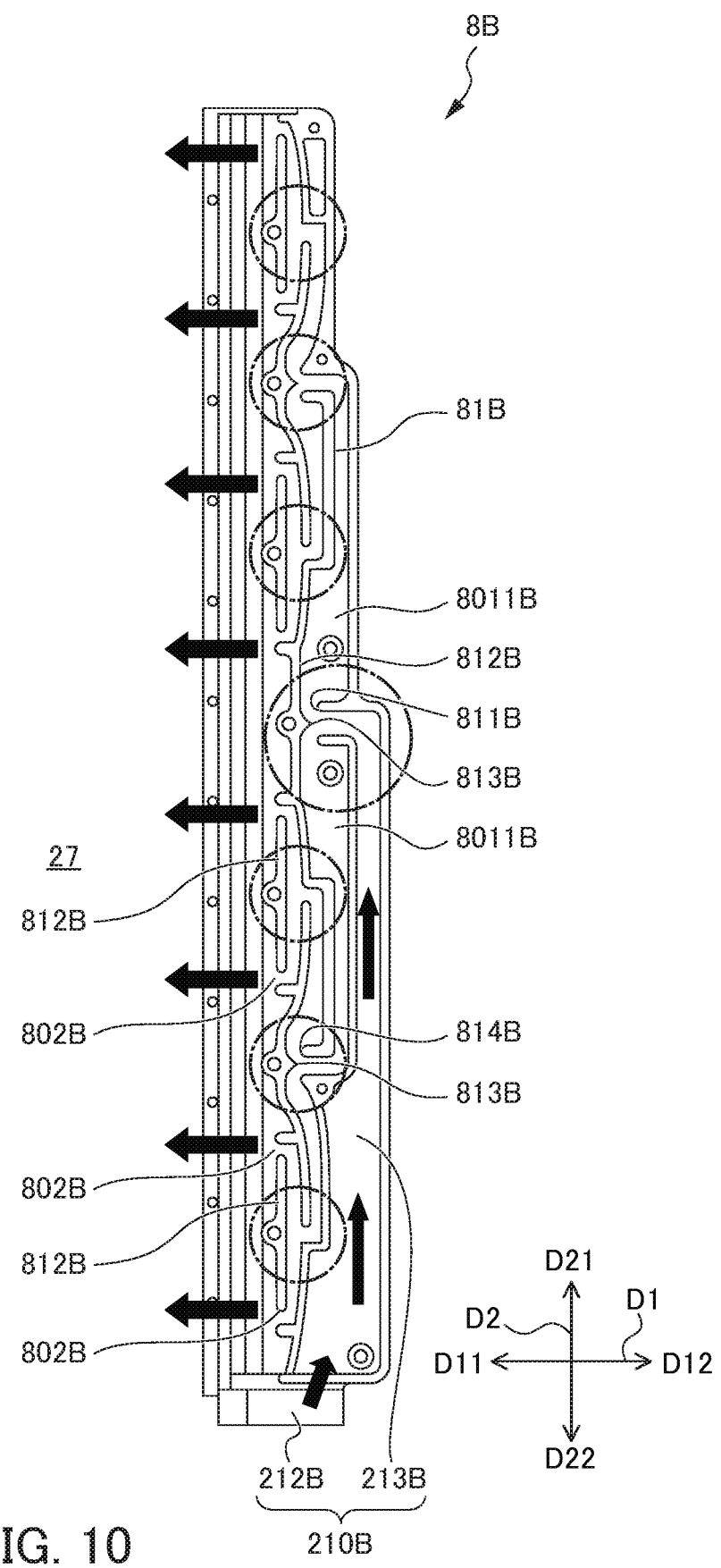
FIG. 10 is a lateral sectional view illustrating a back wall side nozzle portion 8B of a substrate storing container according to a third embodiment of the present invention.
Figure 11:
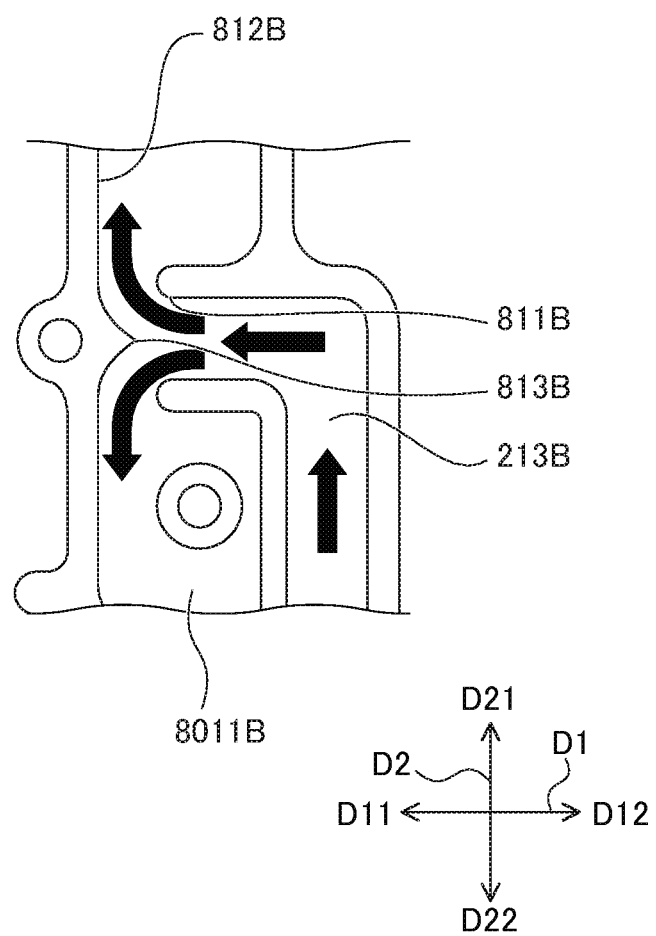
FIG. 11 is an enlarged lateral sectional view illustrating a part where a branch passage 8011B of the back wall side nozzle portion 8B of the substrate storing container according to the third embodiment of the present invention branches.

Next, a substrate storing container according to a third embodiment of the present invention will be described with reference to the drawings. FIG. 10 is a lateral sectional view illustrating a back wall side nozzle portion 8B of the substrate storing container according to the third embodiment of the present invention. FIG. 11 is an enlarged lateral sectional view illustrating a part where a branch passage 8011B of the back wall side nozzle portion 8B of the substrate storing container according to the third embodiment of the present invention branches.

In the third embodiment, the configuration of the back wall side nozzle portion 8B as the gas ejecting nozzle portion is different from the configuration of the back wall side nozzle portion 8A configuring the gas ejecting nozzle portion of the second embodiment. Since other configurations are the same as those of the second embodiment, like elements are denoted by like reference numerals, and description thereof will be omitted.

Between an upper end portion of a vertical extension portion 2B extending from a horizontal extension portion 212B of a ventilation passage 210B in the upper direction D21 and opening portions 802B, branch passages 8011B configuring the gas flow rate uniformizing unit by causing the flow of the purge gas from the ventilation passage 210B to branch are formed. Specifically, as illustrated in FIG. 10, a partition wall portion 81B has a single inflow port 811B. A branch wall portion 812B is provided in the partition wall portion 81B in the forward direction D11. As indicated by a circular part surrounded by a dot-dashed line in FIG. 10, a part of the branch wall portion 812B facing the inflow port 811B has a branch convex portion 813B.

As illustrated in FIG. 11, the branch convex portion 813B has a shape in which the tip decreases in thickness toward the inflow port 811B (in the backward direction D12) and causes the purge gas flowing from the inflow port 811B toward the branch convex portion 813B to branch into the upper direction D21 and the lower direction D22. A discharge port 814B (see FIG. 10) is formed on the downstream side of the purge gas of each flow branched by the branch convex portion 813B, and as indicated by a circular part surrounded by a dot-dashed line in FIG. 10, a part of the branch wall portion 812B facing the discharge port 814B has a branch convex portion 813B.

Similarly, the discharge port 814B and the branch convex portion 813B facing the discharge port 814B form a passage of the purge gas up to the opening portion 8021B, and the passage of the purge gas has a shape like a single elimination tournament table. In the present embodiment, the purge gas branches three times between the inflow port 811B and the opening portions 802B and flows from the opening portions 802B toward the container main body opening portion 21. Incidentally, a part of the partition wall portion 81B facing the discharge port 814B located at the most downstream position does not have the branch wall portion 8128.

According to the substrate storing container according to the present embodiment having the above-described configuration, the following effects can be obtained. The gas flow rate uniformizing unit is the branch passage 8011B formed between the ventilation passage 210E and the opening portions 802B, and is configured by the branch passage 8011B which causes the flow of the purge gas from the ventilation passage 210B to branch. With this configuration, the flow of the purge gas can be reliably caused to branch. As a result, it is possible to cause the purge gas flowing out from the ventilation passage 210B to flow out from each of the opening portions 802B at a similar flow rate, and it is possible to reliably alleviate the Bernoulli phenomenon. In addition, in a small space in the forward/backward direction D1, it is possible to reliably alleviate the Bernoulli phenomenon. Therefore, it is possible to make the gas electing nozzle portion into a compact gas ejecting nozzle portion 8B.

Figure 12:
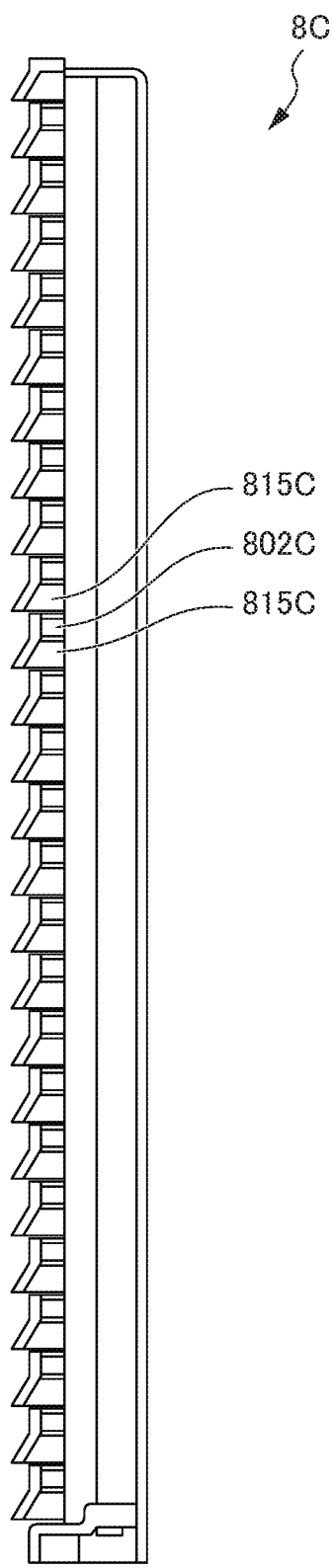
FIG. 12 is a lateral sectional view illustrating a projecting portion 8C of a substrate storing container according to fourth embodiment of the present invention.
Figure 13:
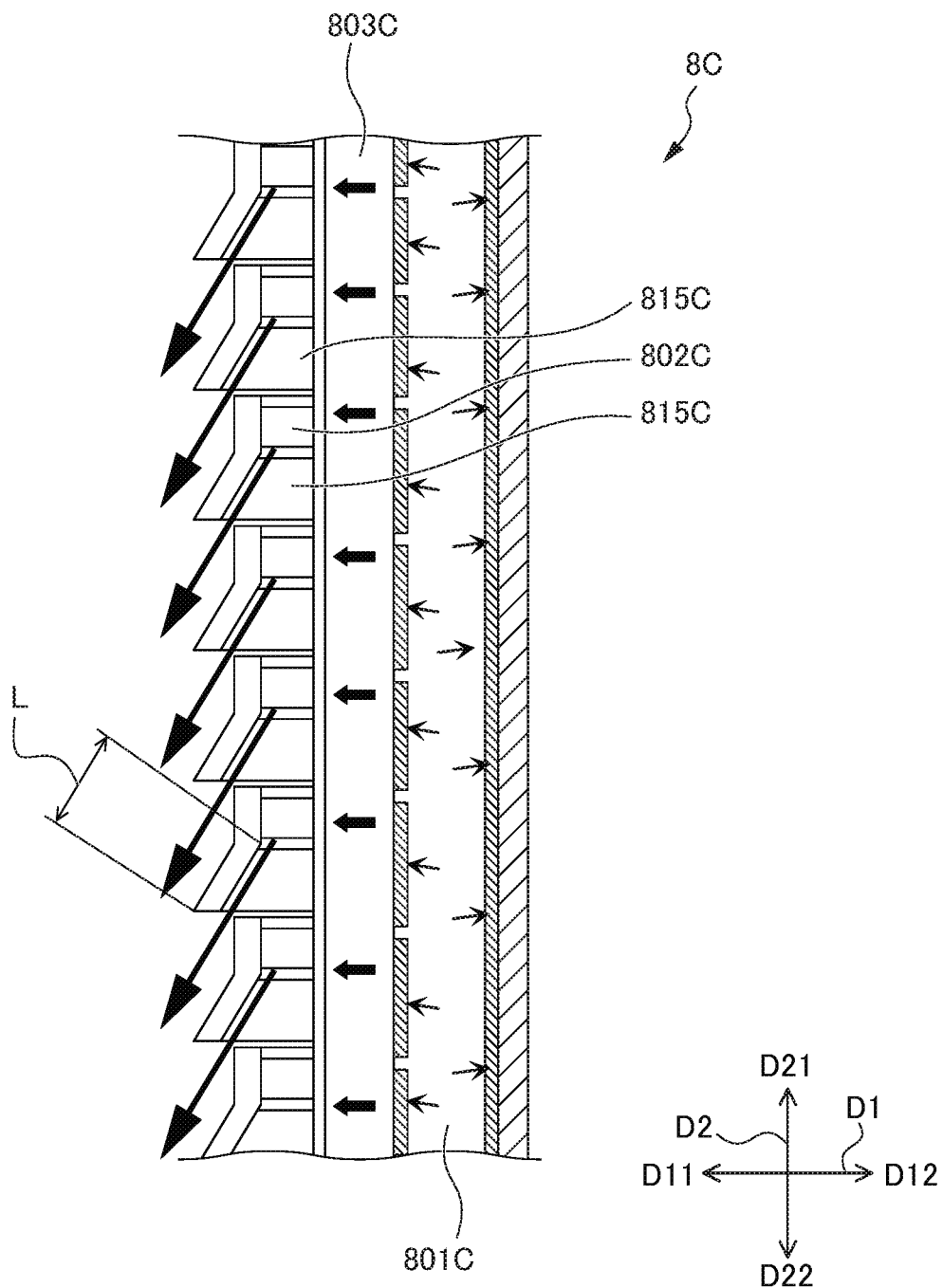
FIG. 13 is an enlarged lateral sectional view illustrating the projecting portion 8C of the substrate storing container according to the fourth embodiment of the present invention.

Next, a substrate storing container according to a fourth embodiment of the present invention will be described with reference to the drawings. FIG. 12 is a lateral sectional view illustrating a projecting portion 8C of the substrate storing container according to the fourth embodiment of the present invention. FIG. 13 is an enlarged lateral sectional view illustrating the projecting portion 8C of the substrate storing container according to the fourth embodiment of the present invention.

In the fourth embodiment, the configuration of the projecting portion 8C configuring the gas ejecting nozzle portion is different from the configuration of the projecting portion 8 configuring the gas ejecting nozzle portion of the first embodiment. Since other configurations are the same as those of the first embodiment, like elements are denoted by like reference numerals, and description thereof will be omitted.

The projecting portion 80 has a cleaning solution inflow inhibiting portion. The cleaning solution inflow inhibiting portion is configured by inclined awnings 815C inclined in the lower direction D22 along the forward direction D11 in the vicinity of opening portions 802C, more specifically, above and below the opening portions 802C. The inclined awnings 815C extend parallel to each other into a length L of about two to three times the width of the opening portion 802C in the upper/lower direction D2. The reason for setting to about two to three times is that when the length L is shorter than twice, the effect of inhibiting the inflow of a cleaning solution into the opening portion 802C is rarely obtained. In addition, when the length L is longer than three times, the effect of inhibiting the inflow of the cleaning solution into the opening portion 802C is substantially the same as the case of three times. The inclined awning 815C inhibits the inflow of the cleaning solution from the opening portion 802C toward a ventilation passage 2100 in the vicinity of the opening portion 802C when the container main body 2 cleaned. In addition, the inclined awning 815C configures a downward outflow portion that allows the gas from the opening portion 802C to flow in the lower direction D22.

According to the substrate storing container according to the present embodiment having the above-described configuration, the following effects can be obtained. The projecting portion 80 has the inclined awning 815C as the cleaning solution inflow inhibiting portion that inhibits the inflow of the cleaning solution from the opening portion 802C toward the ventilation passage 210C in the vicinity of the opening portion 802C when the container main body 2 is cleaned. With this configuration, the inflow of the cleaning solution from the opening portion 802C toward the ventilation passage 210C is suppressed when the container main body 2 is cleaned, so that it is possible to improve dryness after cleaning.

In addition, the projecting portion 8C has the inclined awning 815C as the downward outflow portion that allows the purge gas from the opening portion 802C to flow out toward the lower direction. With this configuration, there is a high possibility that nitrogen ($N_2$) is used as the purge gas, and since $N_2$ is generally lighter than the air, $N_2$ tends to gather on the upper side of the substrate storing space 27 after flowing out from the opening portions 802C. However, it is possible to suppress the gathering of $N_2$ on the upper side of the container main body 2.

Figure 14:
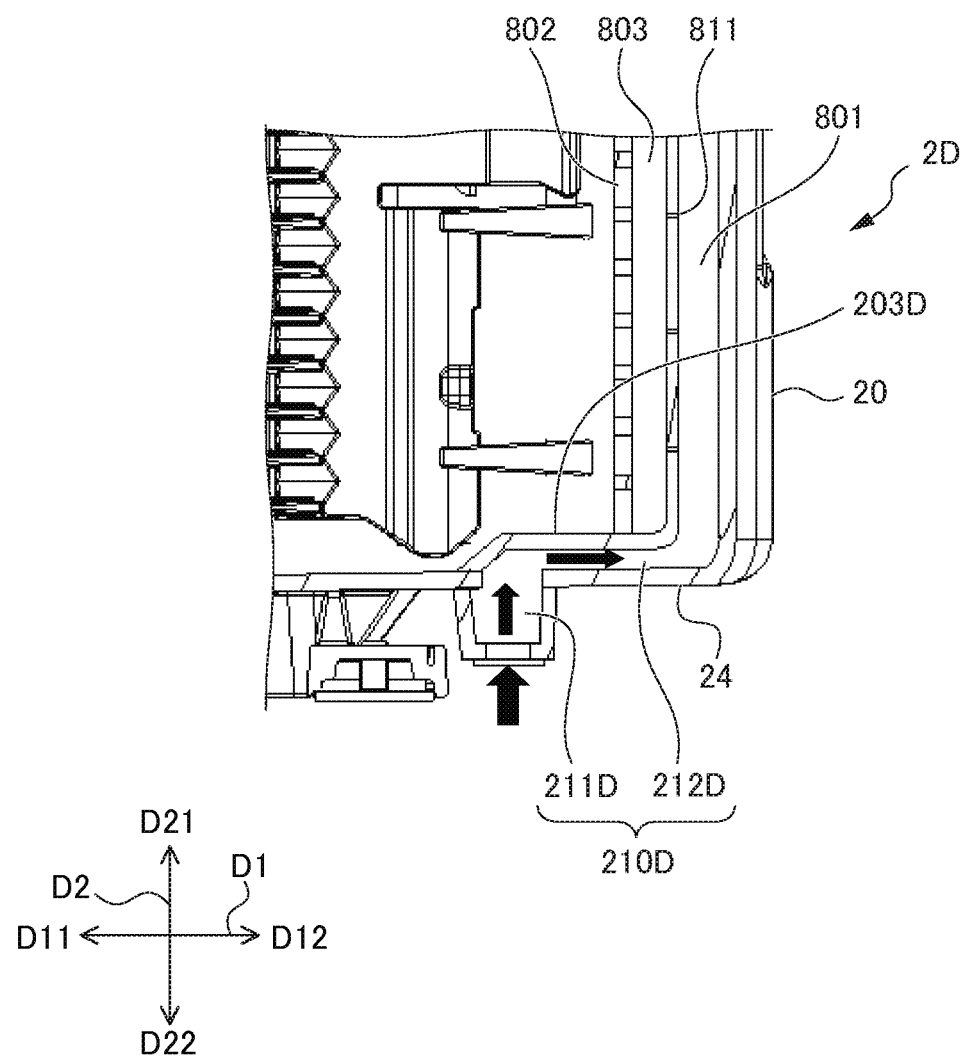
FIG. 14 is an enlarged lateral sectional view illustrating a container main body 2D of a substrate storing container according to a fifth embodiment of the present invention.

Next, a substrate storing container according to a fifth embodiment of the present invention will be described with reference to the drawings. FIG. 14 is an enlarged lateral sectional view illustrating a container main body 2D of the substrate storing container according to the fifth embodiment of the present invention. Incidentally, in FIG. 14, for convenience, illustration of the supply filter portion 90 is omitted.

In the fifth embodiment, the configuration of a ventilation passage 210D is different from the configuration of the ventilation passage 210D in the first embodiment. Since other configurations are the same as those of the first embodiment, like elements are denoted by like reference numerals, and description thereof will be omitted.

As illustrated in FIG. 14, a horizontal extension portion 212D of the ventilation passage 210D extends inside the lower wall 24 along the inner face (upper face) of the lower wall 24 from the upper end portion of a gas inflow portion 211D in the backward direction D12, and is formed by a space between the inner face of the lower wall 24 and an upper flow passage forming portion 203D projecting inward from the lower wall 24.

With this configuration, even in a case where the ventilation passage cannot be secured outside the wall portion 20, the ventilation passage 210D can be secured inside the wall portion 20. That is, it is possible to adopt an optimal configuration depending on the restrictions on an apparatus that handles the substrate storing container, the substrate storing container, and a manufacturing method of the substrate storing container, and it is possible to improve the degree of freedom of the substrate storing container side.

Figure 15:
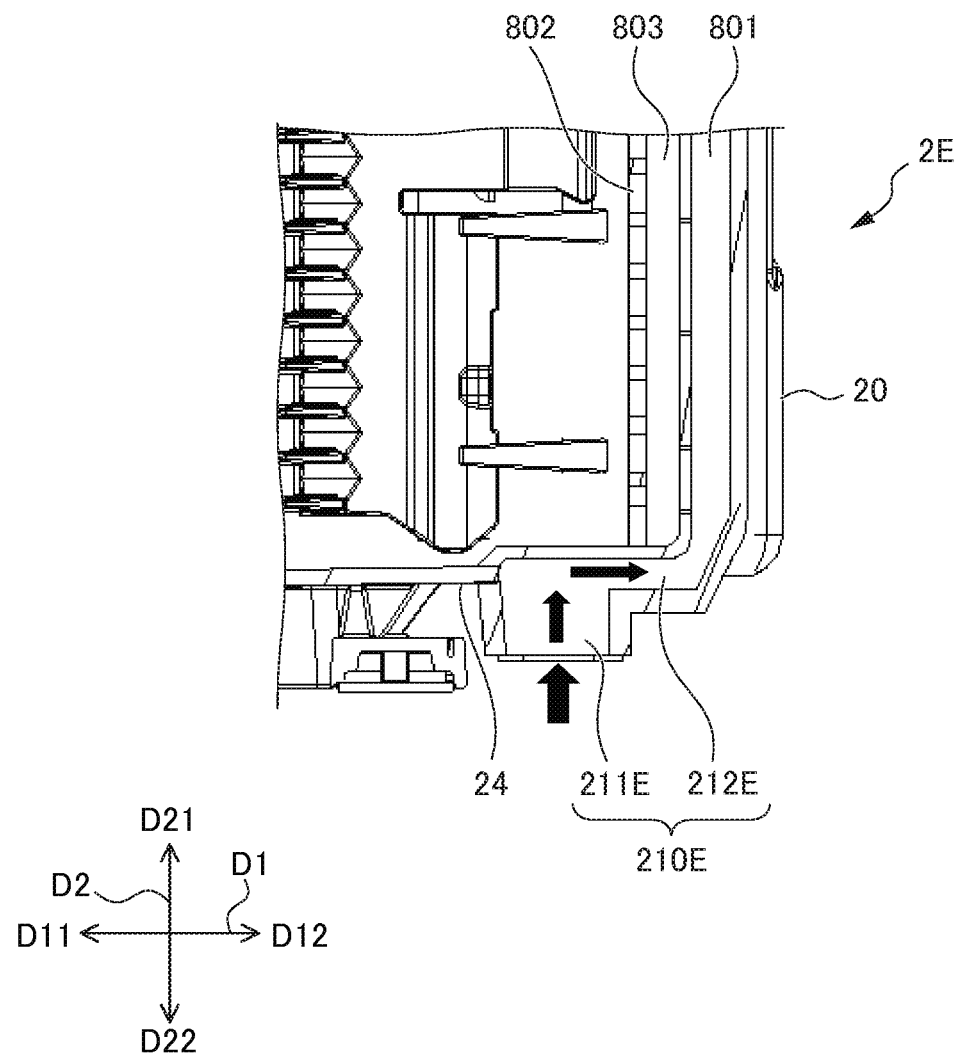
FIG. 15 is an enlarged lateral sectional view illustrating a container main body 2E of a substrate storing container according to a sixth embodiment of the present invention.

Next, a substrate storing container according to a sixth embodiment of the present invention will be described with reference to the drawings. FIG. 15 is an enlarged lateral sectional view illustrating a container main body 2E of the substrate storing container according to the sixth embodiment of the present invention. Incidentally, in FIG. 15, for convenience, illustration of the supply filter portion 90 is omitted.

In the sixth embodiment, the configuration of a ventilation passage 210E is different from the configuration of the ventilation passage 210 in the first embodiment. Since other configurations are the same as those of the first embodiment, like elements are denoted by like reference numerals, and description thereof will be omitted.

As illustrated in FIG. 15, a horizontal extension portion 212E of the ventilation passage 210E extends from the upper end portion of a gas inflow portion 211E in the backward direction D12 along the position of the lower wall 24 in the upper/lower direction D2, and is configured by a space formed at a part where a portion of the lower wall 24 is not present.

With this configuration, even in a case where the ventilation passage cannot be secured outside and inside the wall portion 20, the ventilation passage 210E can be secured at the position of the lower wall 24 of the wall portion 20. That is, it is possible to adopt an optimal configuration depending on the restrictions on an apparatus that handles the substrate storing container, the substrate storing container, and a manufacturing method of the substrate storing container, and it is possible to improve the degree of freedom of the substrate storing container side.

Figure 16:
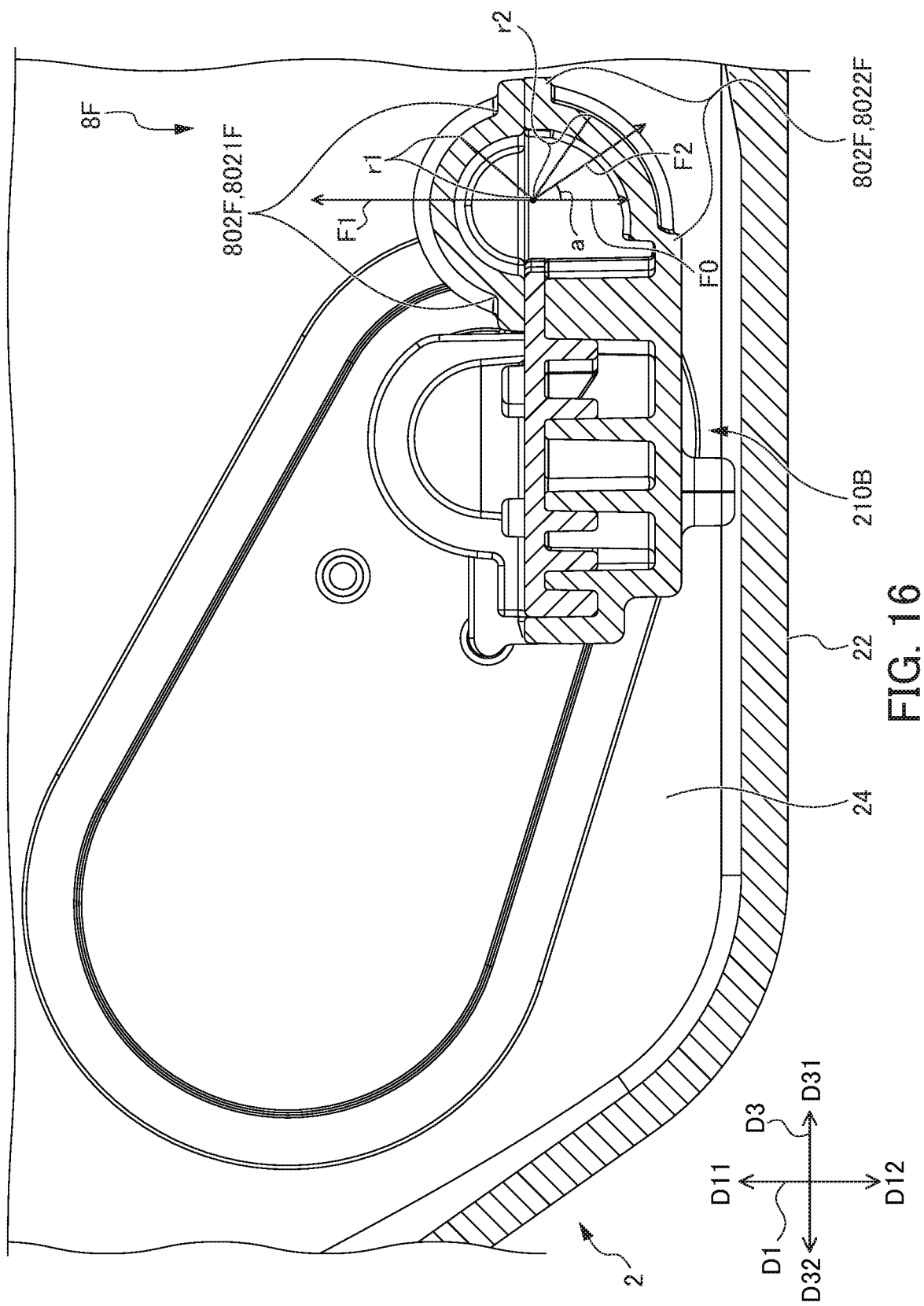
FIG. 16 is an enlarged plan sectional view illustrating a back wall side nozzle portion 8F of a substrate storing container according to a seventh embodiment of the present invention.

Next, a substrate storing container according to a seventh embodiment of the present invention will be described with reference to the drawings. FIG. 16 is an enlarged plan sectional view illustrating a back wall side nozzle portion 8F of the substrate storing container according to the seventh embodiment of the present invention.

In the seventh embodiment, in the nozzle portion 8B of the third embodiment, instead of a part where the opening portion 802B is formed, a part where the opening portion 802C of the fourth embodiment is configured, and the inclined awning 815C is provided as the cleaning solution inflow inhibiting portion. Furthermore, the shape of opening portions (a first opening portion 8021F and a second opening portion 8022F) is set to a shape peculiar to the seventh embodiment. Since other configurations are the same as those of the first, third, and fourth embodiments, like elements are denoted by like reference numerals, and description thereof will be omitted.

An opening portion 802F has the first opening portion 8021F and the second opening portion 8022F. As illustrated in FIG. 16, the first opening portion 8021F is open in a semicircular shape in the forward direction D11 (a direction indicated by an arrow F1 in FIG. 16), which is a direction toward the container main body opening portion 21 where one end of the container main body 2 is positioned. The second opening portion 8022F is open in a fan shape which is open at an angle of 90° toward a direction (a direction indicated by an arrow F2 in FIG. 16) at a predetermined angle with respect to the backward direction D12 (a direction indicated by an arrow F0 in FIG. 16) which is a direction opposite to the direction toward the container main body opening portion 21.

The angle a between the arrow F0 and the arrow P2 is 45°. A radius r2 of the second opening portion 8022F having the fan-like shape is larger than a radius R1 of the first opening portion 8021F having the semicircular shape. Accordingly, although the second opening portion 8022F is formed in a fan shape at an angle of 45°, the area of the opening of the second opening portion 8022F is secured to be an area of about 80% of the area of the opening of the first opening portion 8021F having the semicircular shape. Incidentally, in addition, in FIG. 16, although only the back wall side nozzle portion 8F on the right side is shown, the container main body 2 has left and right target shapes, and thus has a back wall side nozzle portion (not illustrated) on the left side. With the above configuration, the purge gas mainly flows in the direction of the arrow F1 from the first opening portion 8021F and, furthermore, mainly flows in the direction of the arrow F2 from the second opening portion 8022F.

With this configuration, it is possible to cause the purge gas to flow at an appropriate flow rate in a balanced manner in the forward direction D11 which is the direction (the direction indicated by the arrow F1 in FIG. 16) toward the container main body opening portion 21 where one end portion of the container main body 2 is disposed, and in the direction (the direction indicated by the arrow P2 in FIG. 16) at a predetermined angle with respect to the backward direction D12 (the direction indicated by the arrow F0 in FIG. 161 which is the direction opposite to the direction toward the container main body opening portion 21.

The present invention is not limited to the abovementioned embodiments, and modifications thereto within the technical scope claimed in the claims are possible.

For example, the shapes of the container main body and the lid body, and the number and dimensions of substrates W that can be stored in the container main body are not limited to the shapes of the container main body 2 and the lid body 3 and the number and dimensions of substrates W that can be stored in the container main body 2 in the present embodiment. In addition, although the substrate W in the present embodiment is a silicon wafer having a diameter of 300 mm, the diameter is not limited to this value.

In addition, for example, in the present embodiment, the gas flow rate uniformizing unit is configured by the gas uniform holding portion and the branch passage, but the gas flow rate uniformizing unit is not limited thereto. In addition, the gas uniform holding portion is configured by the gas retention chambers 801 and 801A, but the gas uniform holding portion is not limited thereto. In addition, the configuration of the gas retention chamber is not limited to the configurations of the gas retention chambers 801 and 801A in the present embodiment. In addition, the configuration of the branch passage is not limited to the branch passage 8011B. In addition, in the present embodiment, the cleaning solution inflow inhibiting portion is configured by the inclined awning 815C, but the cleaning solution inflow inhibiting portion is not limited thereto. For example, the cleaning solution inflow inhibiting portion may be configured by covering the opening portion 802 with a hydrophobic membrane or a porous body having a porous form.

Furthermore, in the present embodiment, the partition wall portion 81 having the inflow port 811 formed therein is used, but the partition wall portion 81 is not limited thereto. For example, instead of the partition wall portion 81, a membrane or a porous member (porous body) may be used.

In addition, in the second embodiment, the widths of the opening portions 802A in the upper/lower direction D2 and the widths of the opening portions 802A in the left/right direction D3 gradually decrease in the upper direction D21, but the widths are not limited to this configuration. For example, in a case where the opening portions 802A are covered with a membrane or a porous body, the area per unit area of the passage through which the gas passes in the opening portion 802A on the lower side may be set to larger than the area per unit area of the passage through which the gas passes in the opening portion 802A on the upper side so that the amount of air passing through the membrane or the porous body is larger in the opening portion 802A on the lower side than in the opening portion 802A on the upper side.

In addition, in the third embodiment, the branch passage 8011B that causes the flow of the gas from the ventilation passage 210B to branch is provided between the ventilation passage 210B and the opening portions 802B. However, in the case of this configuration, the flow rate of the purge gas flowing out from the discharge port 814B and the opening portions 802B may be adjusted by adjusting the area of the passage after the branch.

In addition, in the first embodiment, as illustrated in FIG. 6, the opening portions 802 are open respectively in the forward direction D11, the left direction D31, and the right direction D32. However, the opening portions 802 are not limited to this configuration. For example, directions employed from among the three directions may be different depending on the shape of the substrate storing container.

In addition, in the present embodiment, the through-holes at the two points of the front portion of the lower wall 24 are the exhaust holes 243 through which the gas inside the container main body 2 is discharged, and the through-holes at the two points of the rear portion thereof are the supply holes 242 through which the gas is supplied into the container main body 2. However, the through-holes are not limited to this configuration. For example, at least one of the two through-holes of the front portion of the lower wall 24 may be a supply hole through which the gas is supplied into the container main body 2. With this configuration, it is possible to supply the purge gas from the lowermost position in the front end portion of the container main body 2.

In addition, the back side substrate support portion is configured by the back side substrate support portion 6 in the present embodiment, but the back side substrate support portion is not limited to this configuration. For example, the back side substrate support portion may be configured by a rear retainer configured by being molded integrally with the container main body.

Furthermore, in the fifth embodiment, the horizontal extension portion 212D of the ventilation passage 210D extends inside the lower wall 24 along the inner face (upper face) of the lower wall 24 from the upper end portion of the gas inflow portion 211D in the backward direction D12, and, furthermore, in the sixth embodiment, the horizontal extension portion 212E of the ventilation passage 210E extends from the upper end portion of the gas inflow portion 211E in the backward direction D12 along the position of the lower wall 24 in the upper/lower direction D2. However, the horizontal extension portion is not limited to this configuration. For example, the horizontal extension portion of the ventilation passage may be configured to branch to extend inside the lower wall along the inner face (upper face) of the lower wall from the upper end portion of the gas inflow portion in the backward direction and extend outside the lower wall along the outer face (lower face) of the lower wall from the upper end portion of the gas inflow portion in the backward direction and then join.

Furthermore, in the back wall side nozzle portion 8F in the seventh embodiment, the first opening portion 8021F is open in the semicircular shape, but is not limited to this shape. In addition, the second opening portion 8022F is open in the fan shape but is not limited to this shape. In addition, the second opening portion 8022F is open in the fan shape that is open at an angle of 90° toward a direction (the direction indicated by the arrow F2 in FIG. 16) at a predetermined angle with respect to the backward direction D12 (the direction indicated by the arrow F0 in FIG. 16) which is a direction opposite to the direction toward the container main body opening portion 21, but is not limited to this direction. In addition, the angle a between the arrow F0 and the arrow P2 is 45°, but is not limited to this angle.

EXPLANATION OF REFERENCE NUMERALS

1 SUBSTRATE STORING CONTAINER
2 CONTAINER MAIN BODY
3 LID BODY
8 PROJECTING PORTION (GAS EJECTING NOZZLE PORTION)
8A BACK WALL SIDE NOZZLE PORTION (GAS EJECTING NOZZLE PORTION)
20 WALL PORTION
21 CONTAINER MAIN BODY OPENING PORTION
22 BACK WALL
23 UPPER WALL
24 LOWER WALL
25 FIRST SIDE WALL
26 SECOND SIDE WALL
27 SUBSTRATE STORING SPACE
28 OPENING CIRCUMFERENTIAL PORTION
210 VENTILATION PASSAGE
801 GAS RETENTION CHAMBER (GAS UNIFORM HOLDING PORTION, GAS FLOW RATE UNIFORMIZING UNIT)
802, 802F OPENING PORTION
815C INCLINED AWNING (CLEANING SOLUTION INFLOW INHIBITING PORTION, DOWNWARD OUTFLOW PORTION)
8011B BRANCH PASSAGE (GAS FLOW RATE UNIFORMIZING UNIT)
8021F FIRST OPENING PORTION
8022F SECOND OPENING PORTION
a ANGLE
r1, r2 RADIUS
W SUBSTRATE

The invention claimed is:
1. A substrate storing container comprising:
a container main body which includes a tubular wall portion in which one end portion has an opening circumferential portion at which a container main body opening portion is formed and the other end portion is closed, and has a substrate storing space formed by inner faces of the wall portion, the substrate storing space being able to store a plurality of substrates and communicating with the container main body opening portion;
a lid body which is removably attached to the container main body opening portion and is able to close the container main body opening portion;
a ventilation passage which enables the substrate storing space and a space outside the container main body to communicate with each other;

a gas ejecting nozzle portion having a plurality of opening portions through which a gas flowing into the ventilation passage is supplied into the substrate storing space; and a gas flow rate uniformizing unit which enables the gas to flow out through the plurality of opening portions at a uniform flow rate, wherein the gas flow rate uniformizing unit is a branch passage formed between the ventilation passage and the opening portions, and is configured by the branch passage which causes a flow of the gas from the ventilation passage to branch, and the opening portions include a first opening portion which is open in a direction toward the container main body opening portion that is located at one end portion of the container main body and a second opening portion which is open in a direction having a predetermined angle with respect to a direction opposite to the direction toward the container main body opening portion.

2. The substrate storing container according to claim 1, further comprising the gas flow rate uniformizing unit which enables the gas to flow out through the plurality of opening portions at a uniform flow rate, wherein the gas ejecting nozzle portion includes a cleaning solution inflow inhibiting portion that inhibits a flow of a cleaning solution from the opening portion toward the ventilation passage side in a vicinity of the opening portion when the container main body is cleaned.

3. The substrate storing container according to claim 2, wherein the gas flow rate uniformizing unit is a gas retention chamber formed between the ventilation passage and the opening portions of the gas ejecting nozzle portion, and is configured by the gas retention chamber configuring a gas uniform holding portion in which the gas is temporarily accumulated and pressurized as the ventilation passage and the opening portions of the gas ejecting nozzle portion communicate with each other and thus the gas from the ventilation passage can be uniformly held in a predetermined amount.

4. The substrate storing container according to claim 2, wherein the wall portion includes a back wall, an upper wall, a lower wall, and a pair of side walls, the other end portion of the wall portion is closed by the back wall, and the container main body opening portion is formed by one end portion of the upper wall, one end portion of the lower wall, and one end portions of the side walls, the back wall has a projecting portion projecting toward the container main body opening portion, and the projecting portion has the opening portions and configures the gas ejecting nozzle portion.

5. The substrate storing container according to claim 1, wherein the wall portion includes a back wall, an upper wall, a lower wall, and a pair of side walls, the other end portion of the wall portion is closed by the back wall, and the container main body opening portion is formed by one end portion of the upper wall, one end portion of the lower wall, and one end portions of the side walls, the gas ejecting nozzle portion is disposed at a center portion of the back wall, and the opening portions of the gas ejecting nozzle portion are open toward the container main body opening portion.

6. The substrate storing container according to claim 1, wherein the first opening portion is formed to be open in a semicircular shape oriented in a direction toward the container main body opening portion, and the second opening portion is formed to be open in a fan-like shape oriented in a direction at an angle of 45° with respect to a direction opposite to the direction toward the container main body opening portion.

7. The substrate storing container according to claim 6, wherein a radius of an opening portion having the fan-like shape of the second opening portion is larger than a radius of an opening portion having the semicircular shape of the first opening portion.

* * * * *